(12) United States Patent
Ausserlechner

(10) Patent No.: US 11,592,500 B2
(45) Date of Patent: Feb. 28, 2023

(54) MAGNETIC-FIELD SENSOR HAVING A MAGNETIC FIELD SENSOR ARRANGEMENT AND A MAGNETIC BODY WITH INHOMOGENEOUS MAGNETIZATION

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 15 days.

(21) Appl. No.: 17/220,419

(22) Filed: Apr. 1, 2021

(65) Prior Publication Data

US 2021/0302512 A1    Sep. 30, 2021

Related U.S. Application Data

(60) Continuation of application No. 14/290,780, filed on May 29, 2014, now Pat. No. 10,996,290, which is a
(Continued)

(30) Foreign Application Priority Data

May 30, 2007   (DE) .......................... 102007025000.4

(51) Int. Cl.
*G01R 33/09*        (2006.01)
*G01D 5/14*         (2006.01)
(Continued)

(52) U.S. Cl.
CPC .............. *G01R 33/09* (2013.01); *G01D 5/145* (2013.01); *G01R 3/00* (2013.01); *G01R 33/02* (2013.01); *Y10T 29/49002* (2015.01)

(58) Field of Classification Search
CPC ...... G01D 5/145; G01D 11/24; G01D 11/245; G01D 3/036; G01D 5/12; G01D 5/14;
(Continued)

(56) References Cited

U.S. PATENT DOCUMENTS 1,401,130 A    12/1921   Billon et al.
3,046,361 A    7/1962    Wiehl
(Continued)

FOREIGN PATENT DOCUMENTS

CN    101545914 A    9/2009
CN    101680777 A    3/2010
(Continued)

OTHER PUBLICATIONS

Ausserlechner, U., "Pick-up systems for vibrating sample magnetometers—a theoretical discussion based on magnetic multipole expansion," Oct. 27, 1993, Meas. Sci. Technol., vol. 5, pp. 213-225.
(Continued)

*Primary Examiner* — Jay Patidar
(74) *Attorney, Agent, or Firm* — Slater Matsil, LLP

(57) ABSTRACT

An embodiment of a magnetic-field sensor includes a magnetic-field sensor arrangement and a magnetic body which has, for example, an inhomogeneous magnetization. The magnetic body has a recess facing the magnetic-field sensor arrangement and resulting in a non-convex cross-sectional area, the magnetic body is annular or comprises an annular section, and the magnetic body is fixedly arranged with respect to the magnetic-field sensor arrangement and forms a back-bias magnet for the magnetic-field sensor arrangement.

20 Claims, 15 Drawing Sheets

Related U.S. Application Data division of application No. 12/130,678, filed on May 30, 2008, now Pat. No. 8,773,124.

(51) Int. Cl.
*G01R 3/00* (2006.01)
*G01R 33/02* (2006.01)

(58) Field of Classification Search
CPC .......... G01D 5/147; G01R 3/00; G01R 33/02; G01R 33/09; G01R 33/0005; G01R 33/0076; G01R 33/06; G01R 33/072; G01R 33/091; Y10T 29/49002; G01P 3/487; H01F 7/0273
See application file for complete search history.

(56) References Cited

U.S. PATENT DOCUMENTS

| | | |
|---|---|---|
| 3,168,686 A | 2/1965 | Graham et al. |
| 3,205,415 A | 9/1965 | Seki et al. |
| 3,493,275 A | 2/1970 | Stone et al. |
| 3,564,314 A | 2/1971 | Haydon et al. |
| 3,768,054 A | 10/1973 | Neugebauer |
| 4,204,158 A | 5/1980 | Ricouard et al. |
| 4,222,021 A | 9/1980 | Bunker, Jr. |
| 4,339,715 A | 7/1982 | Bloodworth et al. |
| 4,654,618 A | 3/1987 | Leupold |
| 4,712,064 A | 12/1987 | Eckardt et al. |
| 4,810,986 A | 3/1989 | Leupold |
| 4,837,542 A | 6/1989 | Leupold |
| 4,849,666 A | 7/1989 | Hoag |
| 5,014,032 A | 5/1991 | Aubert |
| 5,016,040 A | 5/1991 | Dwyer |
| 5,021,736 A | 6/1991 | Gonsalves et al. |
| 5,028,903 A | 7/1991 | Aubert |
| 5,280,209 A | 1/1994 | Leupold et al. |
| 5,337,472 A | 8/1994 | Leupold et al. |
| 5,351,028 A | 9/1994 | Krahn |
| 5,382,936 A | 1/1995 | Leupold et al. |
| 5,477,143 A | 12/1995 | Wu |
| 5,596,272 A | 1/1997 | Busch |
| 5,621,324 A | 4/1997 | Ota et al. |
| 5,634,263 A | 6/1997 | Leupold |
| 5,647,321 A | 7/1997 | Ichikawa et al. |
| 5,781,005 A | 7/1998 | Vig et al. |
| 5,801,529 A | 9/1998 | Umemoto et al. |
| 5,982,178 A | 11/1999 | Pant et al. |
| 5,990,774 A | 11/1999 | Leupold |
| 6,043,646 A | 3/2000 | Jansseune |
| 6,107,793 A | 8/2000 | Yokotani et al. |
| 6,243,190 B1 | 6/2001 | Koguchi |
| 6,278,269 B1 | 8/2001 | Vig et al. |
| 6,501,362 B1 | 12/2002 | Hoffman et al. |
| 6,525,633 B1 | 2/2003 | Leupold |
| 6,559,638 B1 | 5/2003 | Adelerhof |
| 6,577,122 B2 | 6/2003 | Yokotani et al. |
| 6,646,435 B1 | 11/2003 | Nakamura et al. |
| 6,683,544 B2 | 1/2004 | Tokunaga et al. |
| 6,841,958 B2 | 1/2005 | Desbiolles et al. |
| 6,856,224 B1 | 2/2005 | Leupold |
| 6,861,778 B2 | 3/2005 | Izraelev |
| 6,922,052 B2 | 7/2005 | Steinruecken et al. |
| 7,009,384 B2 | 3/2006 | Heremans et al. |
| 7,072,156 B2 | 7/2006 | Cyrille et al. |
| 7,088,095 B1 | 8/2006 | Busch |
| 7,112,955 B2 | 9/2006 | Buchhold |
| 7,119,539 B2 | 10/2006 | Butzmann |
| 7,339,370 B2 | 3/2008 | Reimer et al. |
| 7,595,599 B2 | 9/2009 | Takeuchi |
| 7,839,141 B2 | 11/2010 | Werth et al. |
| 7,906,959 B2 | 3/2011 | Frachon et al. |
| 7,934,291 B2 | 5/2011 | Prest |
| 8,080,993 B2 | 12/2011 | Theuss et al. |
| 8,085,870 B2 | 12/2011 | Sterling |
| 8,169,214 B2 | 5/2012 | Zak |
| 8,174,256 B2 | 5/2012 | Sterling |
| 8,575,920 B2 | 11/2013 | Ausserlechner |
| 8,610,430 B2 | 12/2013 | Werth et al. |
| 8,773,124 B2 | 7/2014 | Ausserlechner |
| 9,153,369 B2 | 10/2015 | Stegerer et al. |
| 9,159,479 B2 | 10/2015 | Rotem |
| 2002/0049553 A1 | 4/2002 | Schmid et al. |
| 2003/0128027 A1 | 7/2003 | Buchhold et al. |
| 2003/0205998 A1 | 11/2003 | Heremans et al. |
| 2003/0227287 A1 | 12/2003 | Hori et al. |
| 2004/0021457 A1 | 2/2004 | Johnson |
| 2004/0150901 A1 | 8/2004 | Hiebert et al. |
| 2004/0201377 A1 | 10/2004 | Buchhold |
| 2004/0263155 A1 | 12/2004 | Schroeder et al. |
| 2005/0007102 A1 | 1/2005 | Butzmann |
| 2005/0140361 A1 | 6/2005 | Gandel et al. |
| 2006/0043963 A1 | 3/2006 | Kaneyasu et al. |
| 2006/0114086 A1 | 6/2006 | Grigorov |
| 2006/0180701 A1 | 8/2006 | Amto |
| 2006/0279280 A1 | 12/2006 | Minamitani et al. |
| 2007/0047152 A1 | 3/2007 | Furukawa et al. |
| 2007/0090827 A1 | 4/2007 | Jarrard |
| 2007/0176597 A1 | 8/2007 | Yamada |
| 2007/0262839 A1 | 11/2007 | Bosely et al. |
| 2007/0290642 A1 | 12/2007 | Shimizu et al. |
| 2008/0036546 A1 | 2/2008 | Taylor et al. |
| 2008/0204001 A1 | 8/2008 | May |
| 2008/0231262 A1 | 9/2008 | Wolf et al. |
| 2008/0265877 A1 | 10/2008 | Kato et al. |
| 2008/0316669 A1 | 12/2008 | May |
| 2009/0058402 A1 | 3/2009 | Zimmer et al. |
| 2009/0066465 A1 | 3/2009 | Ausserlechner et al. |
| 2009/0085700 A1 | 4/2009 | Lian et al. |
| 2009/0146647 A1 | 6/2009 | Ausserlechner |
| 2009/0295382 A1 | 12/2009 | Sterling |
| 2009/0322325 A1 | 12/2009 | Ausserlechner et al. |
| 2010/0141244 A1* | 6/2010 | Bartos ................. G01D 5/12 324/207.21 |
| 2012/0280677 A1 | 11/2012 | Furukawa et al. |
| 2013/0082340 A1 | 4/2013 | Elian et al. |
| 2014/0266179 A1 | 9/2014 | Ausserlechner |
| 2014/0312894 A1 | 10/2014 | Bartos et al. |
| 2015/0002251 A1 | 1/2015 | Lin et al. |
| 2015/0028855 A1 | 1/2015 | Kim et al. |
| 2015/0168124 A1 | 6/2015 | Bondar |
| 2015/0192432 A1 | 7/2015 | Noguchi et al. |
| 2015/0331069 A1 | 11/2015 | Ausserlechner et al. |
| 2016/0169984 A1 | 6/2016 | Werth et al. |

FOREIGN PATENT DOCUMENTS

| | | |
|---|---|---|
| CN | 103376424 A | 10/2013 |
| CN | 104347444 A | 2/2015 |
| CN | 104764470 A | 7/2015 |
| CN | 104793153 A | 7/2015 |
| DE | 2815360 A1 | 10/1978 |
| DE | 1025837 A1 | 2/1992 |
| DE | 19612337 A1 | 10/1997 |
| DE | 10039216 A1 | 2/2002 |
| DE | 10221340 A1 | 11/2003 |
| DE | 10200702500 B3 | 12/2008 |
| DE | 112010005280 B4 | 12/2014 |
| JP | 2005283477 A | 10/2005 |

OTHER PUBLICATIONS

Ausserlechner, U., "The Optimum Layout for Giant Magneto-Resistive Angle Sensors," IEEE Sensors Journal, vol. 10, No. 10, Oct. 2010, pp. 1571-1582.

Drljaca, M., et al., "Design of Planar Magnetic Concentrators for High Sensitivity Hall Devices," Sensors and Actuators A: Physical, vol. 97-98, Apr. 1, 2002, pp. 10-14, Elsevier B.V., Amsterdam, The Netherlands.

Kapser, Konrad, et al., "Integrated GMR based Wheel Speed Sensor for Automotive Applications," Oct. 28-31, 2007, IEEE Sensors 2007 Conference, pp. 848-851.

(56) References Cited

OTHER PUBLICATIONS

Lopez-Martin, A.J., et al., "Performance Tradeoffs of Three Novel GMR Contactless Angle Detectors," IEEE Sensors Journal, vol. 9, No. 3, Mar. 2009, pp. 191-197.

Motz, Mario et al., "An Integrated Hall Sensor Platform Design for Position, Angle and Current Sensing," IEEE Sensors 2006, EXCO, Daegu, Korea, Oct. 22-25, 2006, pp. 1008-1011.

* cited by examiner

MAGNETIC-FIELD SENSOR HAVING A MAGNETIC FIELD SENSOR ARRANGEMENT AND A MAGNETIC BODY WITH INHOMOGENEOUS MAGNETIZATION

This application is a continuation of U.S. patent application Ser. No. 14/290,780, filed May 29, 2014, which application is a divisional of U.S. patent application Ser. No. 12/130,678, entitled "Magnetic-Field Sensor," filed on May 30, 2008, now U.S. Pat. No. 8,773,124, which claims priority to German Patent Application No. 10 2007 025 000.4, which was filed on May 30, 2007, all of which applications are hereby incorporated herein by reference.

TECHNICAL FIELD

Embodiments of the present invention relate to a magnetic-field sensor comprising a magnet also referred to as a back-bias magnet.

BACKGROUND

In many fields of technology, magnetic-field sensors are employed to detect movements of objects, for example. In some applications, a magnetic field acting upon the magnetic-field sensor is influenced by the movement of the respective objects such that conclusions may be drawn in terms of the movement of the object on the basis of the change in the magnetic field detected by the magnetic-field sensor.

Examples are found, among others, in the field of automobile applications, the movement of wheels being monitored in the context of an ABS application (ABS=antilock system), for example, using respective magnetic-field sensors. Other applications in the field of automobile technology include observing or monitoring the movement of crankshafts, camshafts and other shafts in the field of motor vehicles.

Depending on the specific implementation of respective magnetic-field sensors, they comprise so-called back-bias magnets which are located in a fixed arrangement with regard to the actual magnetic sensor elements of the magnetic-field sensor. In such a magnetic-field sensor, the magnetic field detected by the magnetic-field sensor itself may thus be at least partly caused by the back-bias magnet. The object whose movement is to be monitored, for example, via the magnetic-field sensor, possibly influences and/or supplements, by magnets or magnetic components of its own, the bulk magnetic field which will then be detected by the magnetic-field sensor.

Depending on the technology employed in the context of the actual magnetic-field sensor elements, the back-bias magnets, which are frequently implemented as permanent magnets, have different requirements. This may be accounted for, among other things, by the fact that some magnetic-field sensor element technologies are sensitive to different magnetic-field components, exhibit different responses to magnetic fields, and comprise different magnetic-field boundaries specific to the respective type.

SUMMARY OF THE INVENTION

One embodiment of a magnetic-field sensor comprises a magnetic-field sensor arrangement and a magnetic body which comprises a non-convex cross-sectional area with regard to a cross-sectional plane running through the magnetic body, the magnetic body comprising inhomogeneous magnetization.

A further embodiment of a magnetic-field sensor comprises a magnetic-field sensor arrangement, a first magnetic body comprising a first magnetization direction, and a second magnetic body comprising a second magnetization direction, the first and second magnetization directions differing from each other.

One embodiment of a method of producing a magnetic-field sensor includes providing a magnetic body comprising a non-convex cross-sectional area with regard to a cross-sectional plane running through the magnetic body, the magnetic body having an inhomogeneous magnetization, first and second spatial areas with regard to the magnetic body existing, so that in the first spatial area, a magnetic flux density caused by the magnetic body is within a first flux density range, with regard to a predetermined spatial direction, and so that in the second spatial area, a magnetic flux density is caused by the magnetic body, with regard to the predetermined spatial direction, which is within a second flux density range, and arranging a magnetic-field sensor arrangement comprising first and second magnetic-field sensor elements, so that the first magnetic-field sensor element is arranged in the first spatial area, and the second magnetic-field sensor element is arranged in the second spatial area.

A further embodiment of a method of producing a magnetic-field sensor comprises providing a first magnetic body having a first magnetization direction, and a second magnetic body having a second magnetization direction, the first and second magnetization directions differing, a first spatial area and a second spatial area with regard to the first magnetic body and the second magnetic body existing, so that in the first spatial area, a magnetic flux density is caused by the first magnetic body and the second magnetic body with regard to a predetermined spatial direction, the magnetic flux density being within a first flux density range, and so that in the second spatial area, a magnetic flux density is caused by the first magnetic body and the second magnetic body with regard to the predetermined spatial direction, the magnetic flux density being within a second flux density range, and providing a magnetic-field sensor arrangement comprising first and second magnetic-field sensor elements, so that the first magnetic-field sensor element is arranged in the first spatial area, and the second magnetic-field sensor element is arranged in the second spatial area.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

FIGS. 1a to 13 show schematic representations of various embodiments of magnetic-field sensors with their magnetic bodies or back-bias magnets, as well as results of numeric simulations in the form of curves and other representations. However, before giving a more detailed description of a potential application scenario of a magnetic-field sensor in the context of FIG. 2, a description will initially be given of a first embodiment of a magnetic-field sensor along with a magnetic body or back-bias magnet in the context of FIG. 1a.

Figure 1A:
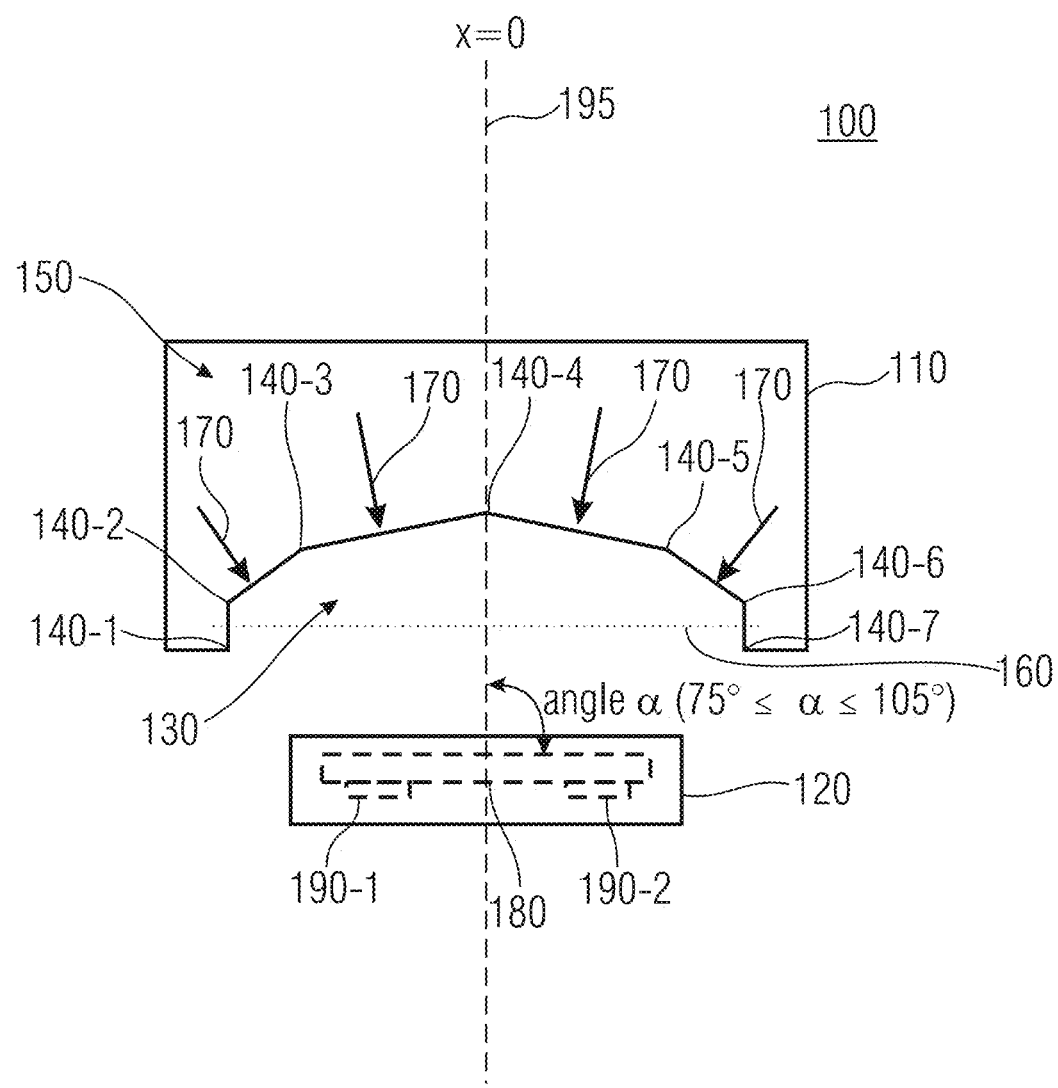
FIG. 1a shows a cross-sectional view of a first embodiment of a magnetic-field sensor.

FIG. 1a shows a first embodiment of a magnetic-field sensor 100 comprising a magnetic body or back-bias magnet 110 and a magnetic-field sensor arrangement 120. The magnetic body 110 in FIG. 1a comprises a recess 130 which faces the magnetic-field sensor arrangement 120 and has a polygonal cross-section with regard to a cross-sectional plane running through the magnetic body, as is depicted in FIG. 1a.

Here, the recess 130 has a polygonal cross-section with a total of seven vertices 140-1 to 140-7 in the embodiment shown in FIG. 1a. Unlike the cross-sectional shape of the magnetic body 110 which is shown in FIG. 1a, in other embodiments of a magnetic-field sensor 100, the recess 130 of the magnetic body 110 may also comprise a number of vertices 140 which deviates from seven. For example, in the case of a triangular recess, with respect to the respective cross-sectional plane running through the magnetic body 110, same could also comprise three vertices 140 only. In principle, however, any number of vertices 140 may define the respective cross-sectional shape of the recess 130 with respect to the cross-sectional plane.

In terms of the extension and the shape of the magnetic body 110 perpendicular to the cross-sectional plane shown in FIG. 1a, a respective magnetic body 110 may comprise, for example, the same cross-sectional shape with regard to a cross-sectional plane which projects beyond the cross-sectional plane shown in FIG. 1a or is perpendicular to it. In other words, depending on the specific implementation of the recess 130, the same shape of the recess with respect to a cross-sectional plane running through a central point or any other designated point the may result. For example, in such a case the set of all potential vertices 140 would form, with respect to a plane perpendicular to the plane shown in FIG. 1a, a circular and/or an ellipsoidal set of points, or possibly a set of points which has the shape of a partial circle or partial ellipsis.

In other embodiments of a magnetic-field sensor 100, the magnetic bodies 110 may exhibit other shapes of the recess 130 with respect to a plane which is not the cross-sectional plane. For example, such a recess 130 may comprise, with respect to a plane perpendicular to the plane shown in FIG. 1a, a cross-sectional shape deviating therefrom. Thus, it is possible, for example, for the respective recess 130 being implemented in the shape of a groove within the magnetic body 110, so that in this case a respective cross-section through the respective magnetic body 110 has, for example, a rectangular shape, a square shape or any other shape which is convex.

Of course, there are other configurations of a magnetic body 110 of an embodiment of a magnetic-field sensor 100, wherein the respective cross-sections perpendicular to the plane shown in FIG. 1a also have polygonal, ellipsoidal or any other cross-sectional shapes.

In addition, other configurations of a magnetic body 110 magnetized in an inhomogeneous manner may naturally also be employed in embodiments of a magnetic-field sensor 100. For example, with regard to the straight connecting line 160 drawn in as a dotted line in FIG. 1a, and/or with regard to the non-convex cross-sectional shape generally defined herein, the magnetic body 110 magnetized in an inhomogeneous manner may also take on a cross-sectional shape "to be regarded as a mirrored thereto", as long as the magnetic body 110 is magnetized in an inhomogeneous manner.

However, in the embodiments presented below, reference shall be made particularly to non-convex magnetic bodies 110 in order to simplify the description, the subsequent illustrations being applicable, however, to essentially all magnetic bodies 110 magnetized in an inhomogeneous manner.

The magnetic body 110 as is depicted, for example, in FIG. 1a thus comprises a non-convex cross-sectional plane 150 with respect to a cross-sectional plane running through the magnetic body 110. In this context, a set of points within a plane, i.e., for example, also the cross-sectional areas such as the cross-sectional area 150, is convex precisely when for any two points, respectively, of the respective quantity it is true that also the direct straight connecting line between these two points runs entirely within the respective quantity, i.e., within the cross-sectional area 150. In other words, a quantity within a plane is convex precisely when all the potential straight connecting lines of all the potential points of the respective quantity run entirely within the quantity.

As was explained above, the cross-sectional area 150 of the magnetic body 110 is non-convex, since, for example, a straight connecting line 160 drawn in as a dotted line in FIG. 1a, whose end points are both located within the cross-sectional area 150, i.e., are elements of the respective quantity, however is not located entirely within the respective quantity, i.e., within the cross-sectional area 150. Rather, the straight connecting line 160 intersects the recess 130. The cross-sectional area 150 is therefore non-convex, so that it may also be referred to as concave. The terms concave and non-convex therefore may possibly be used synonymously.

The magnetic body 110 of the embodiment of a magnetic-field sensor 100 shown in FIG. 1a may be made from a permanent-magnetic material, for example. Depending on the boundary conditions on which an embodiment of a magnetic-field sensor is to be employed, i.e., not least with regard to potential temperatures of use, cost, useful magnetic fields and other parameters, the magnetic body 110 may also be made, for example, from iron, cobalt, nickel or other relatively complex compounds and alloys, which possibly include the above-mentioned metals as components. In principle, respective magnetic bodies or back-bias magnets 110 may be manufactured from ferrites, aluminum-nickel-cobalt (AlNiCo), also samarium-cobalt (SmCo) or neodymium-iron-boron (NdFeB). Of course, other material combinations or materials are also feasible as a field of application for the respective magnetic bodies 110.

As is indicated in FIG. 1a by the arrows 170, the magnetic body, or the back-bias magnet, 110 has an inhomogeneous magnetization. The magnetization M of the magnetic body 110 here has been specifically generated to be inhomogeneous, various magnetizations occurring at various points, particularly within the cross-sectional area 150, which differ at least with regard to their magnitudes or intensities and/or their directions.

In other words, a magnetization of a magnetic body is inhomogeneous when it is largely not homogeneous, a homogeneous magnetization being understood to mean, in the context of the present application, a magnetization which is constant and unidirectional with regard to its direction and intensity. Put differently, the magnetic body 110 has an inhomogeneous magnetization, as is shown by the arrows 170, since its magnetization does not have a constant direction and/or a constant magnitude of the magnetization M, in the vectorial sense, across the entire magnetic body or across a substantial part of the entire magnetic body. In the context of the present application, a substantial portion of the entire magnetic body 110, or of the magnetic body 110, is understood to mean a volume fraction of the magnetic body 110 which ranges from 50% to 100%, i.e., for example, 95%, 90%, 80%, 75%, 70% or 60%, it being possible for the respective volume fractions to result as a function of the respective field of application and implementations of an embodiment of a magnetic-field sensor.

In addition, it should be noted here that for many magnets which comprise, in the entire volume, a magnetization which is constant in terms of magnitude and direction, i.e., which are magnetized in a homogeneous manner, the magnetic field resulting therefrom may be inhomogeneous both on the outside and inside of the magnet. In other words, the presence of an inhomogeneous magnetic field on the outside and/or inside of a magnet need not be an indication that the magnetization, too, is inhomogeneous. In many cases, homogeneous magnetizations are attractive particularly because they may be manufactured in a comparatively simple and inexpensive manner.

The magnetic body 110, or the back-bias magnet 110, of the embodiment of the magnetic-field sensor 100 as is shown, for example, in FIG. 5a, frequently comprises a remanent magnetic flux density ranging from several hundred millitesla (>100 mT) to several tesla (3 T), depending on the example of use. Depending on the specific implementation and specification of an embodiment of a magnetic-field sensor 110, the magnetic body 100 may thus comprise, for example, a "magnetization" or a remanent magnetic flux density Brem of typically 500 mT or 1 T, which exists because of the magnetization. However, it should be noted in this context that the above-mentioned flux density ranges are not to be taken in a limiting sense. Rather, they are merely examples as may be used in some fields of application of embodiments of a magnetic-field sensor 100. In principle, other magnetizations may be used as a function of various parameters, i.e., for example, of the technology of the individual magnetic-field sensor elements, the dimensions of the respective magnetic-field sensor, and other parameters.

In addition to the magnetic body, or the back-bias magnet, 110, the embodiment of a magnetic-field sensor 100 shown in FIG. 1a also comprises the magnetic-field sensor arrangement 120 comprising, for example, a substrate or a chip 180 and one or several magnetic-field sensor elements 190 as optional components. In the embodiment shown in FIG. 1a, the sensor arrangement 120 comprises at least two magnetic-field sensor elements 190-1, 190-2 drawn in in FIG. 1a. Depending on the technology used, the magnetic-field sensor elements 190 may be magneto-resistive sensor elements (xMR sensor elements), Hall sensor elements, or other sensor elements reacting to a magnetic influence, such as magnetic diodes or magnetic transistors.

With regard to the present invention, it should be noted that same may be advantageously employed particularly with such sensors or sensor elements which exhibit saturation behavior, i.e., for example, with xMR sensor elements.

By contrast, Hall probes, for example, have virtually no saturation. However, since the amplifiers connected downstream from the Hall probe exhibit saturation behavior (because the amplifier becomes saturated outside its dynamic range), it may be advantageous also with Hall probes to use the magnetic bodies described here.

The magneto-resistive sensor elements include, among others, AMR sensor elements (AMR=anisotropic magneto resistance), GMR sensor elements (GMR=giant magneto resistance), CMR sensor elements (CMR=colossal magneto resistance), EMR sensor elements (EMR=extraordinary magneto resistance), TMR sensor elements (TMR=tunnel magneto resistance), or spin-valve sensor elements. Hall sensors may be horizontal or vertical Hall sensors.

Depending on the specific implementation, the magnetic-field sensor arrangement 120 may comprise further components, such as an evaluating circuit, a sensor circuit or a respective encapsulating material for protecting the individual magnetic-field sensor elements 190.

In some embodiments of a magnetic-field sensor 100, as is shown in FIG. 1a, for example, the magnetization M has the following symmetry conditions with regard to a symmetry line 195, shown in FIG. 1a, at an x coordinate (x=0) with regard to the x component $M_x$ of the magnetization M and to the y component $M_y$ of the magnetization:

$$M_x(x) = -M_x(-x)$$

$$M_y(x) = M_y(x) \tag{1}$$

This means that the x component of the magnetization $M_x$ has an odd symmetry with regard to the symmetry line 195 at x=0, and that the y component $M_y$ has an even symmetry with regard to the x coordinate and the symmetry line 195. More generally speaking, the magnetization M in some embodiments of a magnetic-field sensor has an odd symmetry relation with regard to the associated magnetic body 110 with respect to a component, and has an even symmetry relation with regard to another component. More specifically, in some embodiments of a magnetic-field sensor, the magnetization M of the magnetic body 110 has an even symmetry relation with regard to a vector component, and has an odd symmetry relation with regard to a vector component perpendicular to the vector component.

Before further embodiments of magnetic-field sensors will be described and explained in connection with FIGS. 1b to 13, it should be noted that objects, structures and components having identical or similar functional properties and features are designated by identical reference numerals. Unless explicitly stated otherwise, the descriptions of objects, structures and components having similar or identical functional properties and features may be interchanged. In addition, in the further course of the present application, summarizing reference numerals shall be used for objects, structures and components occurring several times in one embodiment in an identical or similar manner, or occurring in different figures, embodiments in a similar manner, unless features or properties of a very specific object, structure or component are explained and discussed. Utilization of summarizing reference numerals therefore enables a more compact and clearer description of the embodiments of the present invention.

Figure 1B:
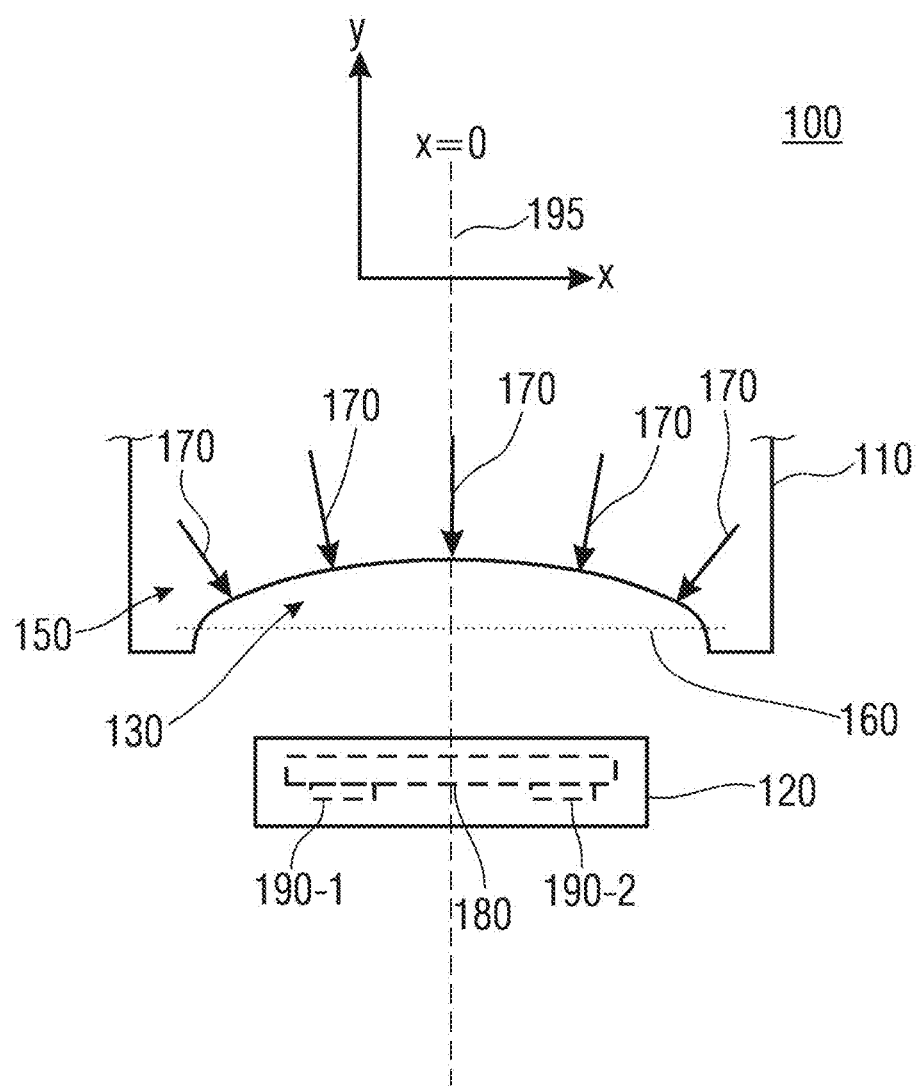
FIG. 1b shows a cross-sectional view of a further embodiment of a magnetic-field sensor.

FIG. 1b shows a further embodiment of a magnetic-field sensor 100 which differs only marginally from the embodiment shown in FIG. 1a. The embodiment of a magnetic-field sensor 100 shown in FIG. 1b again comprises a magnetic body 110, the magnetization M of which being again indicated by the arrows 170. In the embodiment depicted in FIG. 1b, too, the magnetization M is inhomogeneous in a substantial portion of the magnetic body, as is shown by the course of the arrows 170. More specifically, the magnetization M of the magnetic body 110 again has the symmetry conditions described in connection with equation (1).

Unlike the embodiments depicted in FIG. 1a, the magnetic body 110 of the embodiment of a magnetic-field sensor 100 shown in FIG. 1b has a different course with regard to an upper edge. More specifically, in the embodiment depicted in FIG. 1a, an upper edge of the magnetic body 110 is delimited by a straight line, whereas in the magnetic body 110 in FIG. 1b, the magnetic body extends upward beyond the area represented in FIG. 1b. Irrespective thereof, however, in the magnetic body depicted in FIG. 1b, the cross-sectional area 150 is non-convex with regard to the cross-sectional plane reproduced in FIG. 1b, since the direct straight connecting line 160, whose end points are located within the cross-sectional area 150, again itself intersects the recess 130, and thus is located within the cross-sectional area 150. In other words, irrespective of the upper shape or the outer shape, the cross-sectional area 150 of the magnetic body 110 is non-convex irrespective of the specific shape of the outer, upper or lateral demarcation areas of the magnetic body 110.

In addition, the embodiment depicted in FIG. 1b differs with regard to the recess 130. While in the embodiment shown in FIG. 1a it has a polygonal cross-section, in the embodiment shown in FIG. 1b, the cross-section of the recess shown there is ellipsoidal.

Apart from that, the embodiments of a magnetic-field sensor 100 shown in FIGS. 1a and 1b hardly differ. In the embodiment shown in FIG. 1b, a cross-section of the magnetic body 110 may comprise different shapes, a similar shape or even the same shape with regard to a plane perpendicular to the cross-sectional plane shown in FIG. 1b.

In both embodiments shown in FIGS. 1a and 1b, the magnetic-field sensor arrangement 120 is arranged, in relation to the magnetic body 110, such that the arrangement 120 is ideally also located such that is has a center of gravity or central point of the magnetic-field sensor arrangement 120 on the symmetry line 195 as well. In addition, the magnetic-field sensor arrangement 120 ideally is aligned, in relation to the symmetry line 195, such that a connecting line, not drawn in in FIGS. 1a and 1b, of the two magnetic-field sensor elements 190 shown there intersects the symmetry line 195 at right angles. In other words, the magnetic-field sensor arrangement 120 ideally is arranged such that same replicates or adopts the above-described symmetry of the magnetization M of the magnetic body 110. Of course, in case of real implementations of a respective embodiment of a magnetic-field sensor 100, deviations may occur with respect to the shifts in the x direction and/or in the y direction and with respect to a rotation about any of these axes or any axis perpendicular to same.

As will be explained in the further course of the present application, it is this very above-described inhomogeneous magnetization M of the magnetic body 110, in connection with its cross-sectional shape in some embodiments of a magnetic-field sensor while taking into account the technology used of the magnetic-field sensor elements 190, that enables an improvement of an increase in the positional tolerance of the magnetic-field sensor arrangement 120 with regard to the magnetic body 110. In other words, in some embodiments of a magnetic-field sensor 100, a larger tolerance may be achieved with respect to the precise layout of the magnetic-field sensor arrangement 120 without having to accept, in subsequent operation of the embodiment of the magnetic-field sensor 100, disadvantageous effects concerning accuracy of measurement, functionality or other parameters which may possibly be caused by magnetic-field sensor elements 190 which are disadvantageously positioned in relation to the magnetic body 110.

Especially in the case of magneto-resistive magnetic-field sensor elements 190, in some embodiments of a magnetic-field sensor 100 it may be advantageous to implement a magnetic body 110 as is included in the framework of an embodiment. As will be explained below, in some embodiments overdriving of the respective magneto-resistive sensor elements 190 may possibly be inhibited, and/or the positioning tolerance of the respective sensor elements may possibly be increased, while no or hardly any negative consequences are to be expected for the actual measuring operation.

Figure 2:
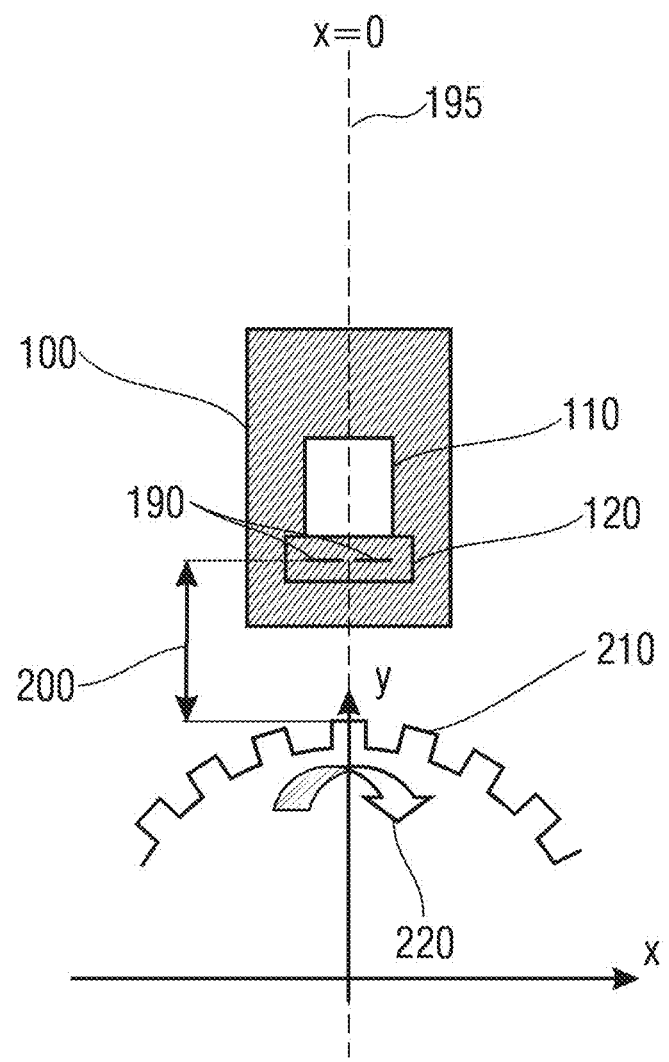
FIG. 2 shows a schematic representation of a potential example of use of an embodiment of a magnetic-field sensor.
Figure 3:
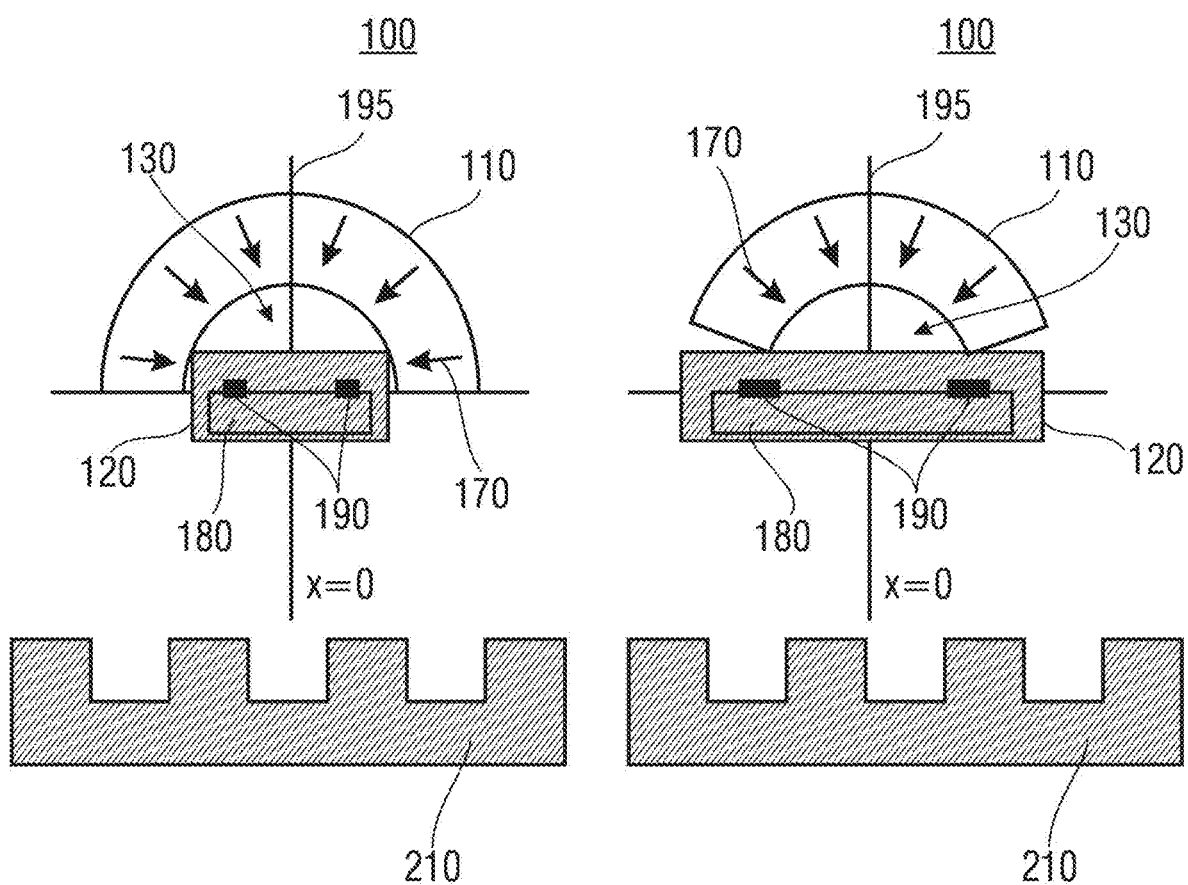
FIG. 3a and FIG. 3b show cross-sectional views of further embodiments of magnetic-field sensors.

FIG. 2 shows a typical field of use of an embodiment of a magnetic-field sensor 100 in connection with determining a rotating rate, or rotating speed, of a shaft. More specifically, FIG. 2 shows an embodiment of a magnetic-field sensor 100 comprising, in addition to a magnetic body 110, which may be implemented as a permanent magnet, for example, and to the magnetic-field sensor arrangement 120, a protective casing included in the magnetic-field sensor 100. As was already explained above, the magnetic-field sensor arrangement 120 additionally comprises two magnetic-field sensor elements 190, which may be magneto-resistive, magnetic sensitive sensor elements, for example. As was explained above, the magnetic body 110 has been drawn in a simplified manner in FIG. 2 without representing the above-explained features of the magnetic body with regard to the magnetization and the cross-section with respect to the cross-sectional plane depicted in FIG. 2. The features were not reproduced in FIG. 2 merely so as to simplify the representation.

At a distance from a plane of the magnetic-field sensor elements 190, the distance being marked by an arrow 200 in FIG. 2 and also being referred to as a magnetic air gap, or air gap, a generator object 210 is mounted below the embodiment of the magnetic-field sensor 100, which is a toothed wheel, which sometimes also is referred to as a permeable generator wheel. Other generator objects 210 include drilled wheels, magnet wheels and other round or ellipsoidal objects suited, on account of their choice of material and/or their topologies, to influence a magnetic field, which has been generated by the magnetic body 110, when a movement of the generator object 210 occurs, and possibly to generate a magnetic flux density themselves in the case of a magnet wheel.

Depending on the specific implementation and application scenario, an embodiment of a magnetic-field sensor 100 may also be employed in connection with other generator objects 210. For example, a respective embodiment may be employed in connection with a magnet rod, drilled rod, or rack as the generator object 210, for example, to detect linear movement or render it detectable. In very many cases, the generator objects 210 comprise a periodic structure with regard to the magnetization, the topology or other features, so that in the case of a movement of the generator objects 210, a periodic change in the magnetic field (among others, that of the magnetic body 110) is caused. The respective generator objects 210 are frequently implemented either as part of a respective moving component, or are connected to same.

In the case of a toothed wheel as the generator object 210, as is shown in FIG. 2, same may be coupled, for example, to a shaft, i.e., a crankshaft or a camshaft, or to a wheel. If the generator object 210 is moved, i.e., in the case of the toothed wheel depicted in FIG. 2, is rotated, as is indicted by the arrow 220, this causes a change in the magnetic field which may be detected by the magnetic-field sensor 100.

Depending on the goal envisaged in the field of applying an embodiment of a magnetic-field sensor 100, movements of wheels may thus be detected, for example, by means of magnetic sensors, as may be desired, for example, in the context of an ABS system. Other embodiments of a magnetic-field sensor 100 may be employed, for example, in the field of engine control and monitoring, e.g., as crankshaft sensors or camshaft sensors. In this context, toothed wheels 210, among others, are used in connection with small permanent magnets as magnetic bodies 110 on the rear side of the actual sensors or of the magnetic-field sensor arrangement 120. Moving or rotating the wheel then results in a sinusoidal magnetic field in the area of the magnetic-field elements 190, the component of the magnetic field being evaluated at the chip level, or substrate level, in the case of magneto-resistive sensors (xMR sensors). At the same time, the direction of the rotary motion of the wheel may possibly also be evaluated and detected by a further sensor or by means of other technical measures.

In many applications, a small permanent magnet is thus mounted as a magnetic body 110 on a magnetic-field sensor arrangement 120, so that both may be arranged before a tooth-wheel shaped permeable disk, as is schematically depicted in FIG. 2. When the disk is rotated, the teeth of the toothed wheel 210 pass the plane of the magnetic-field sensor elements 190 at the distance of the magnetic air gap and thus generate a small field variation which may be detected by the embodiment of the magnetic-field sensor 100 and which comprises information on the angular position and the rotating speed of the disk. In many cases, the waveform of the magnetic-field variation is nearly sinusoidal, and its amplitude drastically decreases as a function of an increasing (magnetic) air gap.

In the case of a toothed wheel as the generator object 210, as is depicted in FIG. 2, the amplitude of the waveform frequently decreases roughly exponentially, in proportion to a ratio of the magnetic air gap and the so-called pitch (possibly multiplied by a factor of $2\pi$). In this context, the so-called pitch is defined as the quotient of half the circumference of the toothed wheel, divided by the number of teeth if same are equidistantly distributed across the circumference of the toothed wheel. Thus, the pitch represents half the period of the toothed wheel. For this reason, it may be advisable, in some embodiments of a magnetic-field sensor 100 and in various fields of application of same, to operate embodiments as close to the generator object 190 as possible so as to bypass and to prevent, e.g., magnetic air gaps larger than approximately the width of a tooth. An increase in the magnetic air gap from about the width of one tooth to about 150% of the width of a tooth may reduce a magnetic field amplitude by more than a factor of 5, for example, depending on the specific circumstances. For example, the amplitude depends on $\exp(-2Pi*z/\text{lamda})$, lamda being the magnetic period, i.e., lamda/2 is a width of a tooth, or a width of a gap between two teeth. If z=lamda/2 increases to z=1.5*lamda/2, the amplitude consequently will change by a factor of $\exp(-Pi)/\exp(-Pi*1.5)=4.8$.

In the case of magneto-resistive sensor elements, i.e., for example, GMR sensor elements 190, it may happen that a respective magnet arrangement overdrives the individual GMR sensor elements 190 with regard to the magnetic-field components in the plane of the substrate or of the chip. In such a case, it may happen that the magnetic-field sensor element(s) 190 concerned will not provide any measurement signals, or measurement signals which are hardly usable.

Thus, even if, for example, the toothed wheel 210 is positioned symmetrically to the chip of the magnetic-field sensor arrangement 120, i.e., if, for example, a tooth center or a gap center of the toothed wheel 210 is directly in a (xx=0) position also drawn in in FIG. 2, it may happen that the flux lines of the magnet diverge, as a result of which inadmissibly large Bx components will act upon the two (magneto-resistive) magnetic-field sensor elements 190 shown in FIG. 2. As was already explained in connection with FIGS. 1a and 1b, the (x=0) position here is defined by the symmetry line 195, which in connection with FIG. 2 relates to the position located precisely between the two magneto-resistive sensor elements 190 shown in FIG. 2.

In such a case, both magneto-resistive sensor elements 190 are driven into saturation, and can no longer give off any (usable) signal. In some applications wherein an embodiment of a magnetic-field sensor 100 is employed, a common remanence of the magnetic bodies or back-bias magnets 110 used is in a range of just above 1 tesla (T). Typical toothed wheels as generator objects 210 comprise teeth and gaps approximately 3 mm wide, the depth of the gap also corresponding to about 3 mm. Of course, other dimensionings of respective toothed wheels or other generator objects may occur in other examples of use. Also, the respective embodiments of magnetic-field sensors 100 are not limited to these values. It shall be noted in the context of the present invention that large magnetic fields at the xMR element may be achieved, for example, using large magnets or using large remanences, or using a small demagnetization factor.

Depending on the specific application, the magneto-resistive sensor elements 190 are typically arranged within a range of about 1 mm before the magnet or magnetic body 110, and the toothed wheel itself is arranged about 1 to 4 mm before the magneto-resistive sensor elements 190, so that the magnetic air gap is also within this range. In some applications and, thus, in some embodiments of a magnetic-field sensor 100, the magnetic or magnetic body 110 has a cross-section of 5 mm in the x direction, and of 6 mm in the y direction, the magneto-resistive sensor elements 190 at the chip being spaced apart by about 2.5 mm. In such a case, it may happen that the Bx component of the magnetic field strength on the right-hand one of the two magnetic-field elements 190 ranges from about 95 to 117 mT, the different values resulting as a function of the (magnetic) air gap.

Accordingly, in the case of a symmetric layout, Bx components ranging from −95 to −117 mT act upon the left-hand sensor element 190. Depending on the specific implementation of the magnetic-field sensor element 190, in particular in the case of a GMR magnetic-field sensor element, such a sensor element frequently has a linear drive range of up to +/−15 mT. If such a GMR sensor element 190 is highly overdriven by the magnet, it will no longer function in a useful manner and will no longer be able to provide useful measurement signals.

With other GMR sensor elements 190 it may happen that they become saturated already at a magnetic flux density of about 10 mT. Thus, if there are magnetic-field components, or magnetic flux density components, of more than 100 mT at the location of the GMR sensor elements 190, the latter will be driven into saturation, so that small superimposed alternating magnetic fields as may be caused by the generator object 210 are no longer detectable. It may therefore be useful in such a case to reduce the above-described magnetic flux density by a factor of 15.

If, for example, merely a modulation of between 12 mT and 14 mT is caused by a tooth at a saturation field strength of about 10 mT of a GMR sensor element, the respective GMR sensor element in many cases may no longer provide a usable output signal, so that the sensor overall may no longer be able to detect the rotation of the generator object 210.

As was already explained above, the above numerical indications in particular serve illustration and are not to be understood in a limiting sense. Embodiments of magnetic-field sensors 100 may be employed within a very wide range of magnets or magnetic bodies 110, and within a very wide range of different magnetic-field sensor elements 190. Also, in the case of respective application scenarios, embodiments may be combined with very many different generator objects 210 so as to form speed sensors, for example, or other magnetic-based sensors.

FIGS. 3a and 3b show two further embodiments of magnetic-field sensors 100. More specifically, the two embodiments are depicted along with a generator object 210, respectively, it being possible for the generator object 210 to be a rack or a toothed wheel, for example, which is depicted without any curvature in FIGS. 3a and 3b in order to simplify the representation.

The embodiments of magnetic-field sensors 100 depicted in FIGS. 3a and 3b thus each comprise a magnetic body 110 which again comprises, with respect to the cross-sectional plane shown in FIGS. 3a and 3b, a non-convex cross-section having a recess 130, the recess 130 being configured to be circular in the case of the embodiments shown in FIGS. 3a and 3b. Of course, it may be noted in this context that the designations circular or ellipsoidal may also be applied to respective sectors and portions of the respective geometric figures, i.e., of a circle or an ellipsis.

In the embodiments of a magnetic-field sensor 100 depicted in FIGS. 3a and 3b, the magnetic bodies 110, or the two back-bias magnets 110, again have an inhomogeneous magnetization, as is depicted by the arrows 170 in both figures. Depending on the specific implementation of an embodiment, here, too, the magnetic-field sensor arrangement 120 may possibly include a casing, also referred to as a package, in addition to the chip or the substrate 180 and the (magneto-resistive) magnetic-field sensor elements 190, i.e., GMR magnetic-field sensor elements, for example.

In the embodiments depicted in FIGS. 3a and 3b, the magnet or magnetic body 110 is configured as part of a ring, and is essentially radially magnetized, as is indicated by the arrows 170. More specifically, the magnetic body 110 here has an annular shape, but in other embodiments of a magnetic-field sensor 100, it may also have other shapes, such as that of a flat or upright ellipsis. As was already explained in the context of FIG. 1b, it may suffice for the magnetic body 110 to comprise an inner recess so that the above-described magnetization of the magnetic body 110 may be performed. Basically, any outer demarcation curve desired may thus be provided, in principle. As was explained before, in some embodiments of a magnetic-field sensor 100, the inner recess may be circular, ellipsoidal or polygon-shaped. In other words, in different embodiments of a magnetic-field sensor, the magnetic body may have a non-convex cross-section or a non-convex cross-sectional area in relation to a cross-sectional plane.

FIG. 3a thus shows an embodiment wherein the magnetic body 110 extends over 180° and is configured as an annulus. By contrast, in the embodiment depicted in FIG. 3b, the magnetic body 110 depicted as an annulus extends over less than 180°. Depending on the specific implementation, the magnetic body 110 may also extend over more than 180°.

The sensor IC (IC=integrated circuit), or the magnetic-field sensor arrangement 120 may be moved, or shifted, both "to within the magnet" and to the area of the recess 130, as is depicted in FIG. 3a. In the case of relatively small magnets 110, or even in the case of limited design space, the magnet 110 may also be placed on the back of the sensor IC, wherein a front side and a bottom side of the IC 120 may be used equally well in many cases with regard to the fixing described, depending on the specific implementation of an embodiment of a magnetic-field sensor 100.

However, in many cases of application it may be advisable to move the GMR sensor elements 190 as close to the toothed wheel or the generator object 210 as possible, so that it may possibly be advisable in such a case to secure the magnet 110 on that side of the chip 120 which contains no components (e.g. the magnetic-field sensor elements 190). In such a case, it may thus be advisable to secure the magnetic-field sensor arrangement 120 to the magnetic body 110 such that it is rotated by 180° in relation thereto as compared to the representation of FIGS. 3a and 3b, i.e., to secure it in a precisely inverse manner to that depicted in FIGS. 3a and 3b. The magnetic-field sensor elements 190 thus may be located such that they are rotated by 180° in relation to the substrate 180 and the generator object 210.

Depending on the specific implementation, a typical dimension may thus comprise, in the case of embodiments as are shown in FIGS. 3a and 3b, an outside diameter of about 9 mm and an inside diameter of about 5 mm in relation to the shape of the magnetic body 110. A strength of the remanent magnetization again may be higher than about 500 mT or higher than about 1 mT, depending on the specific implementation of an embodiment.

In some embodiments, the spacing between the two sensor elements 190 is about the size of a tooth or a tooth gap of a generator object 210. In some embodiments, or in some cases of application, this may be, for example, 2.5 mm for the distance between the two outer sensor elements shown in FIGS. 3a and 3b. Depending on the specific implementation, a central sensor element may be employed, for example, for detecting the direction, it being possible for the central sensor element to be arranged in the center between the left-hand and right-hand sensor elements. However, in some fields of application, other distances between the sensor elements 190 are useful. Other distances, for example 1.7 mm, may also be used.

The surface of the chip 180 in many cases is arranged at a distance before the magnet 110 ranging from about 0.5 mm to about 2 mm, distances of about 0.7 mm frequently representing a useful compromise, since on the one hand, the magnet 110 should be located as close as possible to the chip 180, and thus, to the magnet wheel 210 and, on the other hand, a thickness of mounting components (package bottom, lead-frame thickness, die-attach thickness, and silicon thickness) frequently is in a range of about 0.7 mm. A distance of the chip 180 from the generator object 210, also referred to as an air gap, may amount to several tenths of a millimeter as a minimum, but as a maximum should not exceed a spacing of the width of about four teeth or four tooth gaps in some fields of application, since with larger air gaps, the magnetic field signal amplitude will decrease exponentially.

Figure 4:
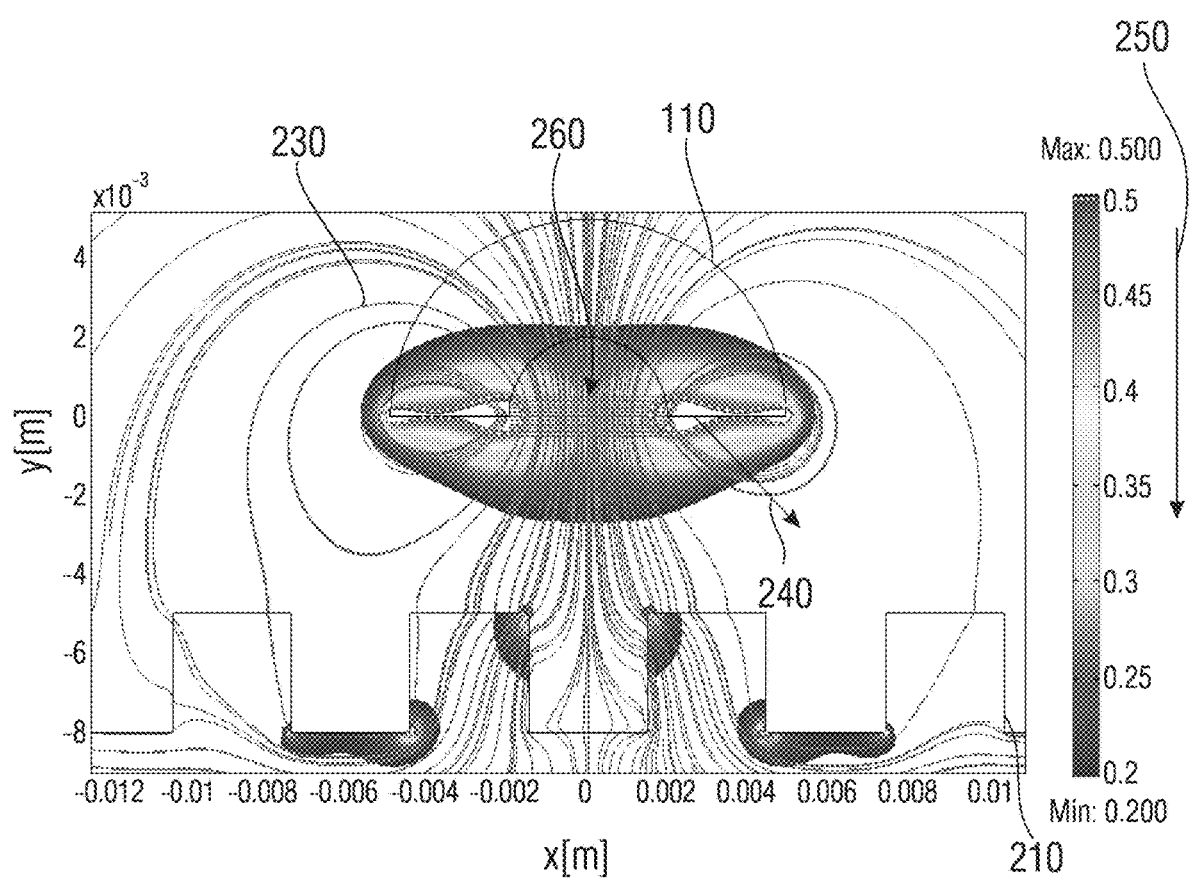
FIG. 4 shows a result of a numeric simulation of a resulting magnetic fluid density in the case of an embodiment of a magnetic-field sensor and its back-bias magnet.

FIG. 4 shows a result of a numerical simulation of a magnetic field strength curve and of magnetic field lines as result in the case of a magnetic body 110 as is described in the context of FIG. 3a and the embodiment discussed there. Calculating magnetic fields, as have caused, for example, the magnetic field curve shown in FIG. 4, in many cases is anything but trivial and basically comes down to solving the four Maxwell differential equations for electromagnetic fields. There are indeed simplified forms for special cases, which possibly may be solved in a closed form, but specifically for calculating magnetic fields, magnetic flux densities and other curves and characteristics discussed in the context of the present application, numeric simulation, which may be performed, for example, on the basis of a two-dimensional or three-dimensional simulation using the finite elements method is generally indispensable. Respective simulations and calculations may be performed, for example, on the basis of the equation $$B = \mu_0 \int_V \frac{\text{red}M \text{xdegrees}_A r}{4\pi r^2} dV, \quad (2)$$

while taking into account the respective boundary conditions, B being the magnetic induction or the magnetic flux density as a vectorial quantity, $\mu_0$ designating the permeability of the vacuum, red M designating the rotation of the (vectorial) magnetization, degree$_A$ r designating the gradient of the positional coordinate with regard to the starting point A, and r being the distance between the starting point and the source point. Integration is performed across the entire space, i.e. not only within the material of the magnetic body 110, but also across its surface, which is indicated by the "integration boundary" V in equation (2).

In addition to the magnetic body 110, FIG. 4 also schematically depicts the generator object 210 shown in FIGS. 3a and 3b. In addition to a multitude of field lines 230, for some areas, the respective magnetic flux density of between 0.2 T to a maximum of 0.5 T is additionally depicted in FIG. 4. Here, an arrow 240 in the inner part of the representation in FIG. 4 marks a decrease of the magnetic field strength as is depicted by an arrow 250 in the area of the legend.

FIG. 4 thus represents the cross-section of the magnetic body in the form of an annulus extending over 180° and being magnetized in the radial direction, as was already described in connection with FIG. 3a. The toothed wheel as the generator object 210 here is positioned symmetrically to the magnet 110. In this position, the Bx component of the magnetic flux density at the location of the magnetic-field sensor elements 190 (not shown in FIG. 4) should ideally be as close to zero as possible, but at least within the linear control range of a GMR sensor element, i.e., for example, between approx. −15 mT and +15 mT.

The result, shown in FIG. 4, of a numeric simulation is based on, with regard to the magnetic body 110, a remanence of 1 T of the magnetic body 110, the remanence extending homogeneously across the entire magnetic body 110 in terms of magnitude. However, the direction of the magnetization, which due to its radial nature is inhomogeneous, is exempt therefrom.

Figure 5:
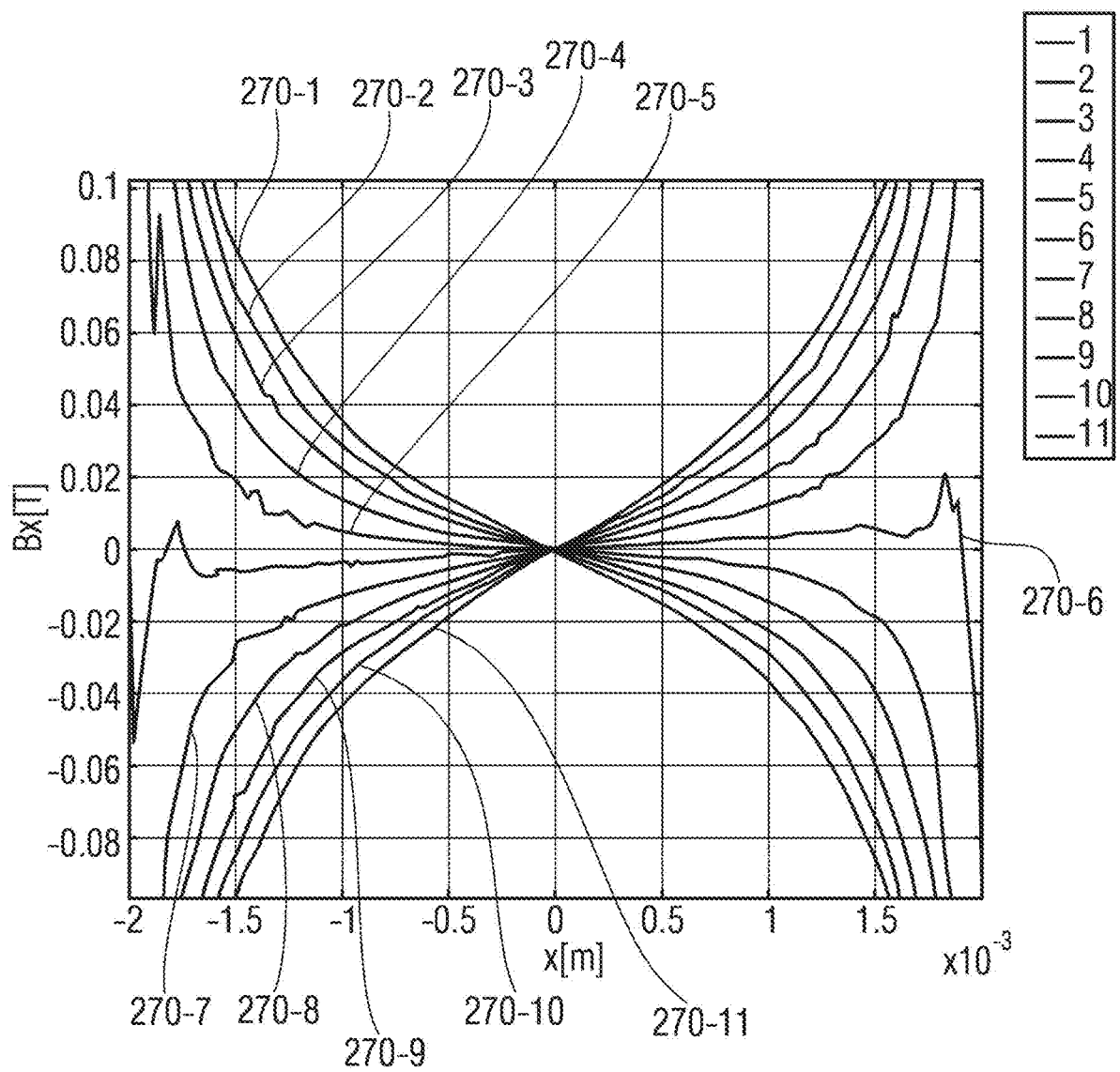
FIG. 5 shows a representation of an x component of the magnetic flux density in the event of the back-bias magnet shown in FIG. 4.

In addition, FIG. 4 has horizontal lines 260 drawn in between the end faces of the magnet, in the area of the lines 260, the magnetic field strength Bx having been evaluated as a function of the x coordinate in the context of the curves represented in FIG. 5 which follows.

FIG. 5 depicts a total of eleven curves 270-1 to 270-11 reproducing the magnetic flux density Bx in tesla (T) for the lines 260 represented in FIG. 4. The curves 270 here correspond, in an ascending order, to their numbers which are indicated after the hyphen in the context of the reference numerals, to the y positions y=−0.5 mm, −0.4 mm, −0.3 mm, −0.2 mm, −0.1 mm, 0 mm, +0.1 mm, +0.2 mm, +0.3 mm, +0.4 mm, +0.5 mm.

The curves 270 show that due to the symmetry of the arrangement, the x component of the magnetic flux density Bx versus the x coordinate x almost vanishes for the case of y=0 (curve 270-6), and thus would represent a basically ideal position for the GMR sensor elements. If, for example, the magnetic-field sensor elements 190 are positioned such that they are symmetrically distributed around x=0 at a distance of 1.25 mm, i.e., at the x positions x=+/−1.25 mm, y positions ranging from y=−0.1 mm to y=+0.1 mm are quite suited to ensure x components of the magnetic field strength of, in terms of magnitude, less than 20 mT (|Bx|<20 mT), as the curves 270-5, 270-6, 270-7 for the y positions y=0.1 mm, 0 mm, +0.1 mm show. The curves 270 essentially comprise a mirror symmetry with regard to the point (x, Bx)=(0 m, 0 T). As compared to a simple cubic magnet having a continually homogeneous magnetization, a reduction of the x component of the magnetic flux density Bx may thus be achieved by employing an embodiment of a magnetic-field sensor 100, it sometimes being possible for the reduction to amount to as much as one order of magnitude.

Figure 6A:
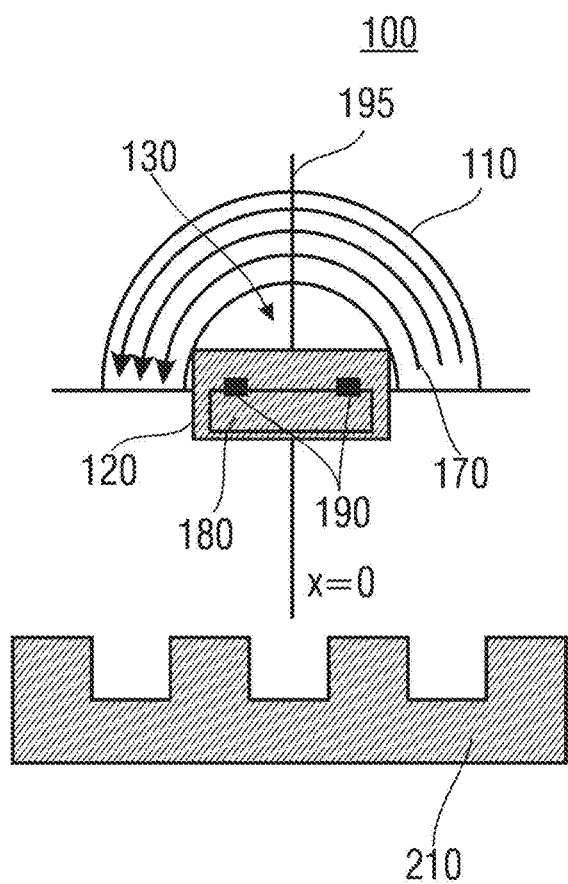
FIGS. 6a and 6b show cross-sectional views of further embodiments of magnetic-field sensors.
Figure 6B:
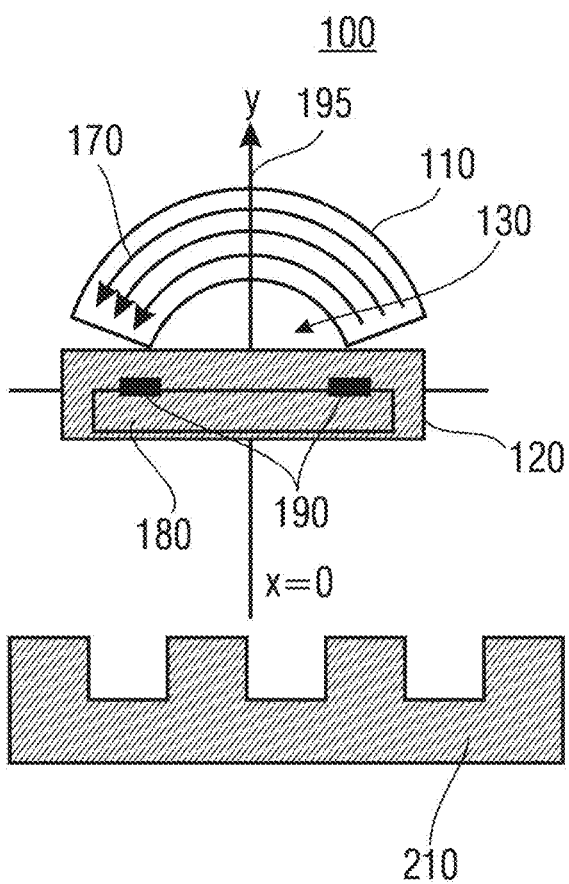

FIGS. 6a and 6b show further embodiments of a magnetic-field sensor 100 which are similar to the embodiments of FIGS. 3a and 3b, but differ from same in that the magnetic bodies 110 are magnetized in an azimuthal manner, as is indicated by the arrows 170. With this possibility of an embodiment of a magnetic-field sensor 100, the magnetic body 110 may, as is depicted, for example, in FIG. 6a, comprise an annular cross-section extending over 180°. Likewise, as is depicted in FIG. 6b, it may comprise a cross-section extending over less than 180°. The magnet 110 of the embodiment shown in FIG. 6b may therefore be regarded as "cut off in the radial direction", other shapes of the magnetic body 110 being also possible, of course. For example, magnetic bodies 110 wherein the end faces are cut off, for example, in the x direction or in the y direction are also conceivable. As was already explained above in the context of FIGS. 1a, 1b, 3a, and 3b, the outer shape of the magnetic body is less decisive in this context. Therefore, other directions which are oblique to the above-mentioned directions are also possible as "sectional directions" of the magnetic body 110.

Apart from the magnetization M as is depicted by the arrows 170 in FIGS. 6a and 6b, the embodiments of a magnetic-field sensor 100 which are shown in the figures hardly differ, or do not differ at all, from the embodiments shown in FIGS. 3a and 3b in terms of the further components. For this reason, reference shall be made, particularly with respect to the further components, to the respective descriptions thereof.

The magnetization of the magnetic body 110 as is depicted in FIGS. 6a and 6b thus obeys the following symmetry conditions with respect to the x component $M_x(x)$ and the y component $M_y(x)$:

$$M_x(x)=M_x(-x)$$

$$M_y(x)=-M_y(-x) \qquad (3).$$

This means that in this case the x component of the magnetization has an even symmetry relation with respect to the symmetry line 195 (x=0), whereas the y component of the magnetization in this case meets an odd symmetry relation with respect to x. In this case, too, it may be stated in some embodiments of a magnetic-field sensor 100 that one of the two magnetization components $M_x$ and $M_y$ meets an odd symmetry relation with regard to x, whereas the other meets an even symmetry relation with regard to the x coordinate.

Figure 7:
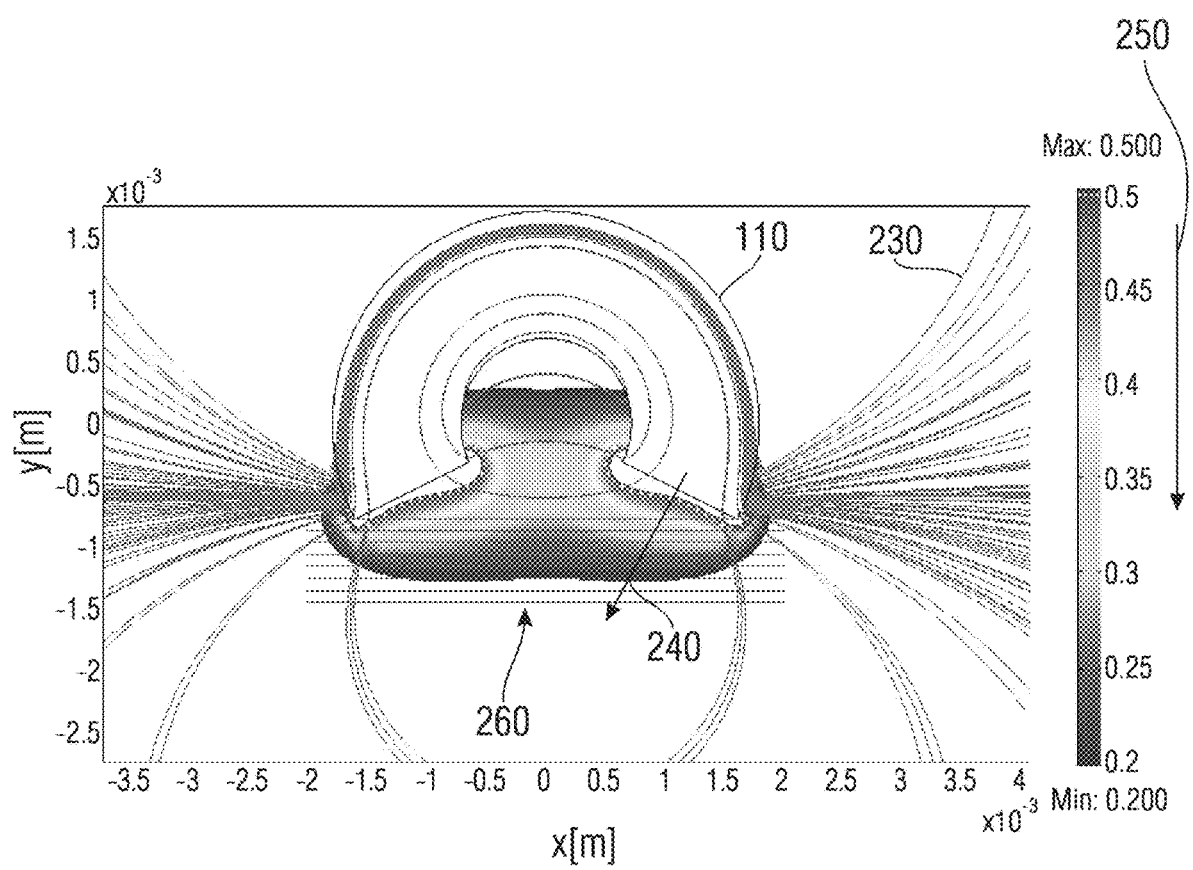
FIG. 7 shows a result of a numeric simulation of a magnetic flux density for an embodiment of a magnetic-field sensor or of its back-bias magnet.

FIG. 7 shows a representation of a result of a numeric simulation which is based on a magnetic body 110 comprising an extension of more than 180° and being magnetized in the azimuthal direction, the magnitude of the magnetization being set to be constant across the volume of the magnetic body 110. In other words, the results of the simulation shown in FIG. 7 are based on an embodiment of a magnetic-field sensor comprising a magnetic body 110 magnetized in the azimuthal direction at a constant magnitude, so that the magnetization again is inhomogeneous due to the changing direction of same. Here, FIG. 7 again shows a plurality of field lines 230 as well as an arrow 240 in the inner part of the representation which corresponds to a direction along a decreasing magnetic flux density ranging from 0.5 T to 0.2 T, as is also indicted by the arrow 250. In addition, different lines 260 are again drawn in FIG. 7, which relate to the curves 270 reproduced in FIGS. 8 and 9. In other words, within the context of the following FIGS. 8 and 9, suitability of the different lines 260 with regard to a potential position for the magnetic-field sensor elements 190 is examined.

Figure 8:
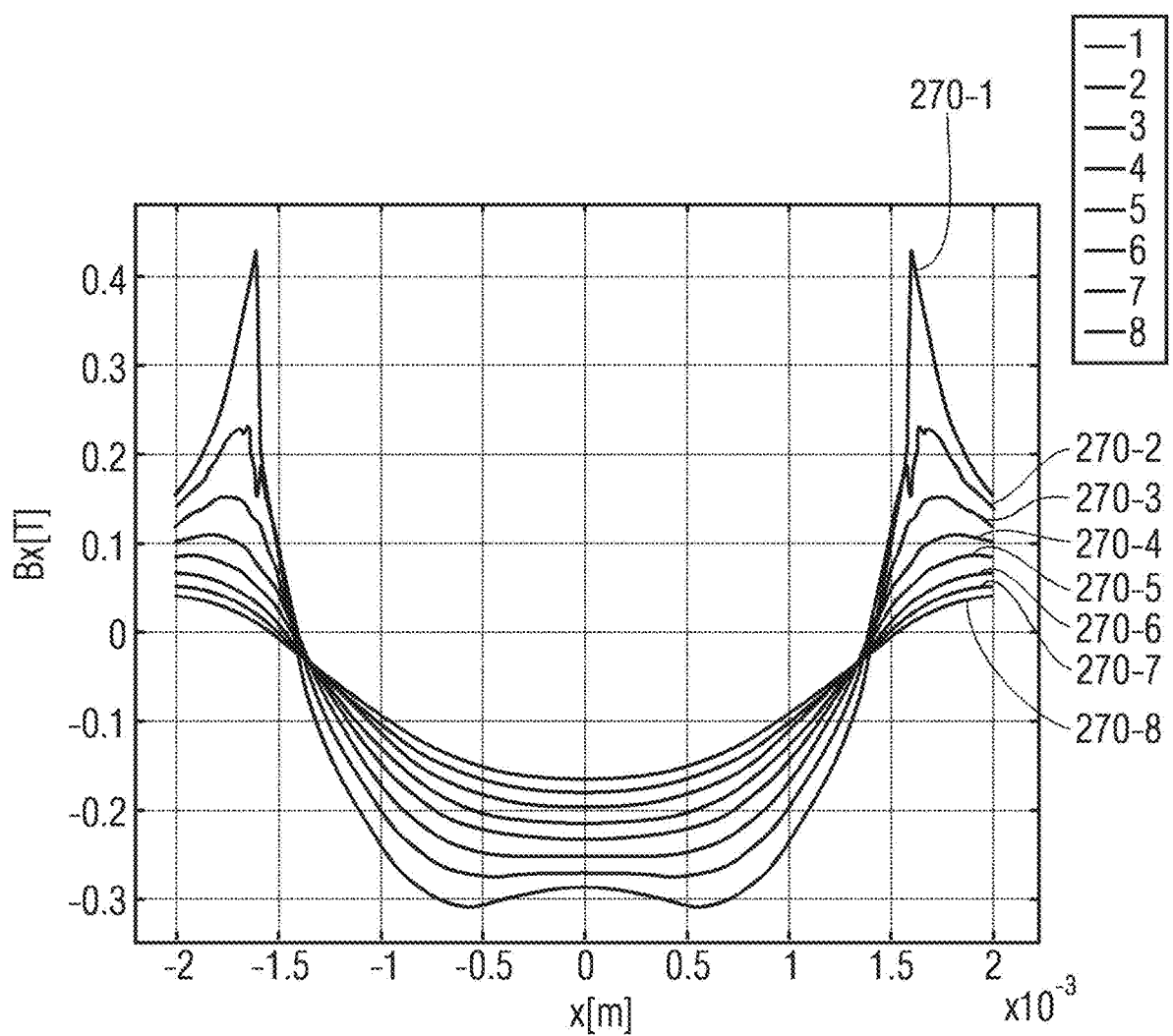
FIG. 8 shows a curve of x components of the magnetic flux density for the numeric simulation shown in FIG. 7.

FIG. 8 shows curves 270-1 to 270-8 of the x component of the magnetic flux density Bx as a function of the x coordinate for different y coordinates. More specifically, the curve 270-1 here corresponds to a y coordinate of y=−0.8 mm, the y coordinate being reduced by 0.1 mm in each case as numeral of the respective curve increases, the curve being reproduced after the hyphen in the context of the reference numeral. Consequently, the curve 270-2 corresponds to a y coordinate of y=−0.9 mm, and, for example, the curve 270-8 corresponds to a y coordinate of y=−1.5 mm. Here, FIG. 8 initially shows the respective curves 270 on a coarse scale in a range from x=−2 mm to x=+2 mm, while FIG. 9 represents a magnification of the represented range from about x=1.0 mm to x=1.85 mm.

Thus, FIG. 8 initially shows that almost independently of the y parameter selected in each case, in the range from about x=1.3 mm and x=1.4 mm, all curves 270 have an x component of the magnetic flux density Bx which ranges from about +/−(20 mT-40 mT). At a smaller distance from the magnet or magnetic body 110, i.e., for higher y values, the curves 270 in the range of around x=+/−1.4 mm run through the $B_x=0$ line, so that this may represent quite a suitable location for magneto-resistive sensor elements 190, i.e., GMR sensor elements 190, for example.

Figure 9:
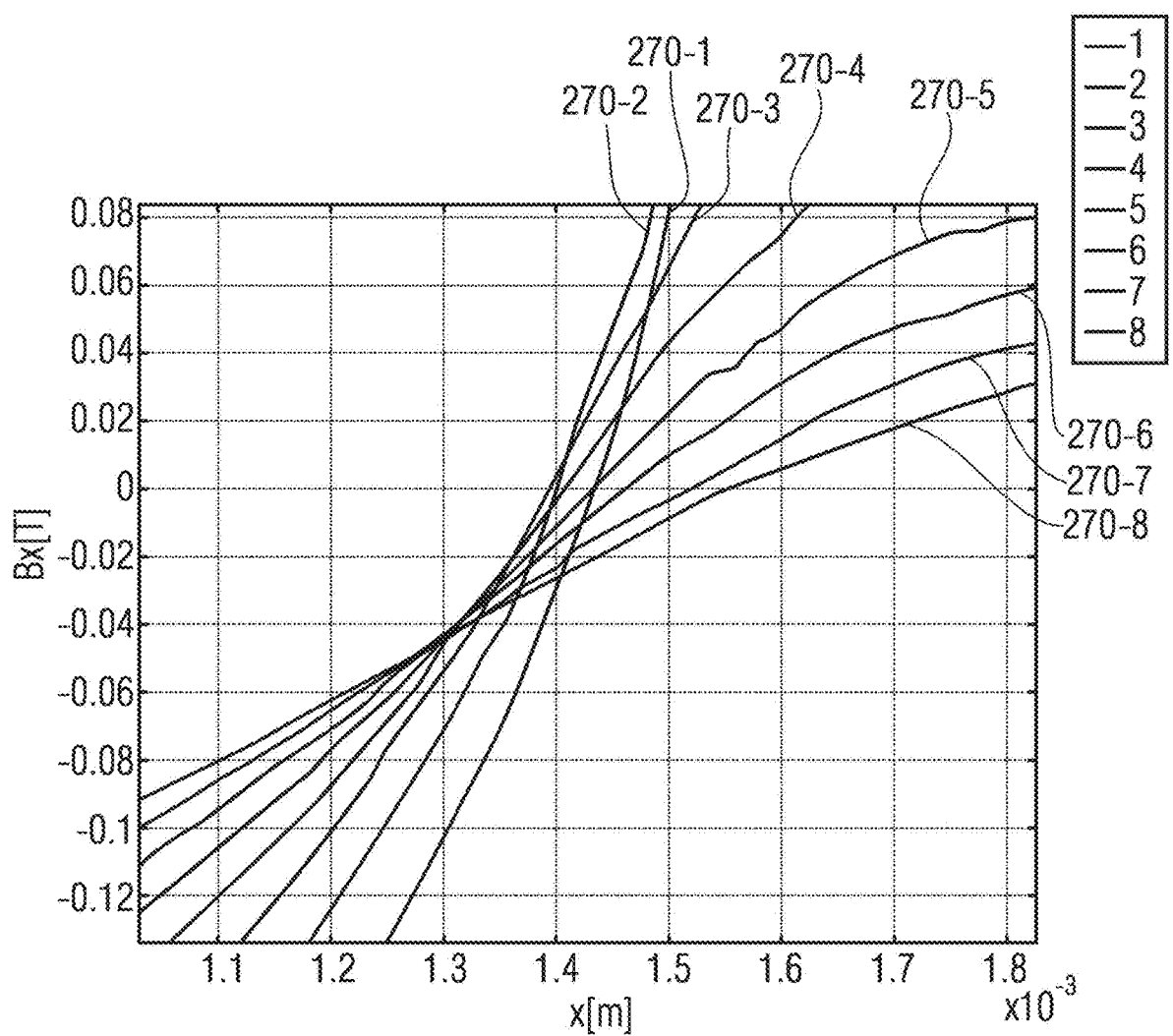
FIG. 9 shows a magnified representation of the curves shown in FIG. 8.

Accordingly, in FIG. 9, the range of the curves depicted in FIG. 8 is represented in a magnified manner in the range of around x=1.4 mm. For example, FIG. 9 shows that in particular the curves 270-2, 270-3 and 270-4, which correspond to the y parameters y=−0.9 mm, −1.0 mm and −1.1 mm, intersect the "Bx=0" line in the range of around x=1.4 mm, as is shown by the detailed image in FIG. 9.

Before further embodiments of a magnetic-field sensor 100 will be described in the context of FIGS. 10a and 10b, a short outline shall be given of a method with which the inhomogeneous magnetizations discussed in the preceding figures may be realized. In the case of the magnetic bodies 110 which comprise radial or quasi-radial magnetizations, as are shown, for example, in FIGS. 1a, 1b, 3a, and 3b, a counterpart which is suitably shaped and made of iron, for example, may be inserted into the recess 130 of the respective magnetic body, the counterpart seamlessly adjoining the surface, suitably shaped, of the magnetic body 110. Also, an iron part, suitably shaped, may be placed into the outer surface from the outside, so that the future magnetic body 110 is covered by respective iron parts from the outside and the inside. Subsequently, the two iron parts may be interconnected by a clamp which may take on almost any shape desired. A winding may be wound around the clamp, the winding having current applied thereto in order to generate the magnetization.

In the case of a magnetic body having an azimuthal magnetization, a circular conductor may be placed inside the magnet, i.e., into the recess 130 of the magnetic body 110, and a circular conductor may be fit snuggly, ideally seamlessly, to the magnetic body 110 on the outside. If a current flowing in the inner metallic conductor is sent out of the drawing plane drawn in in FIG. 6a and FIG. 6b, respectively, and if in the outer conductor, a corresponding current is sent into the drawing plane, the respective magnetization within the magnet 110 will be aligned in the azimuthal direction in an anticlockwise manner.

Figure 10A:
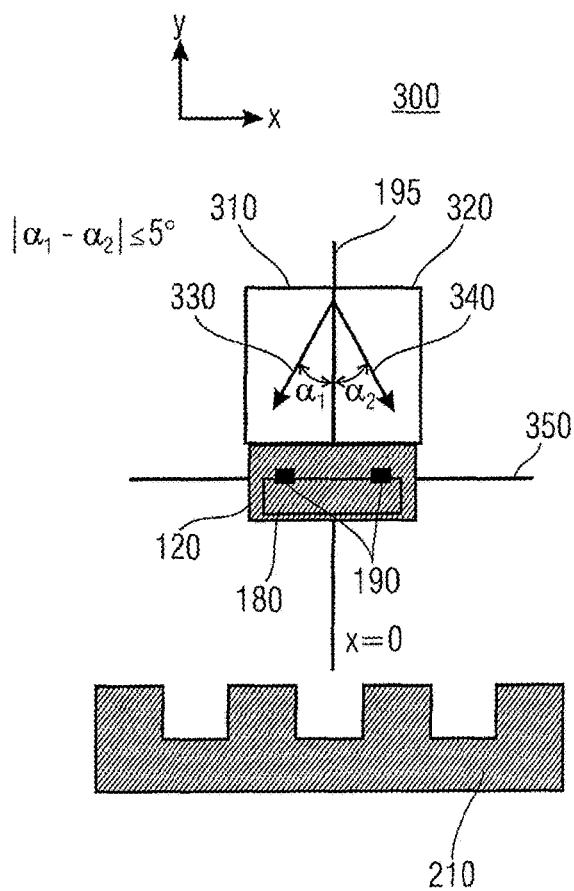
FIG. 10a and FIG. 10b show cross-sectional representations of further embodiments of magnetic-field sensors.
Figure 10B:
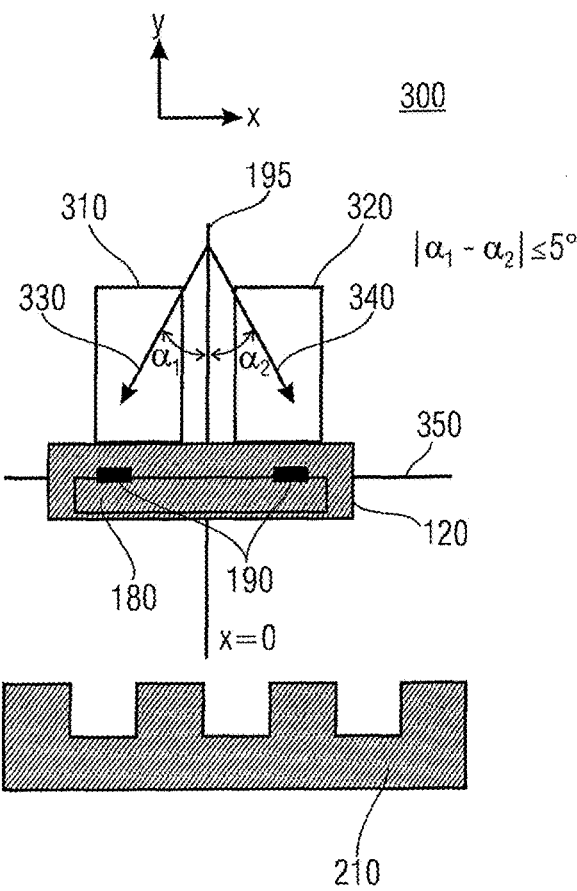

FIGS. 10a and 10b show further embodiments of a magnetic-field sensor 300 differing from the above-shown embodiments of respective magnetic-field sensors 100 in that the embodiments shown here comprise a first magnetic body 310 and a second magnetic body 320, the first magnetic body 310 comprising a first magnetization direction which is characterized by an arrow 330 in FIGS. 10a and 10b, respectively. Likewise, the second magnetic body 320 has a magnetization direction plotted by an arrow 340 in FIGS. 10a and 10b, respectively. The two magnetization directions of the two magnetic bodies 310, 320 differ from each other and form an angle with each other.

With regard to a symmetry line 195, which again corresponds to an x coordinate of x=0, the magnetization directions (arrows 330, 340) of the two magnetic bodies 310, 320 each form an angle with the symmetry line 195 which is identical, in terms of magnitude, for the two magnetic bodies 310, 320, or which does not deviate from one another by more than typically 20°, 10°, 5° or 2°, depending on the specific implementation of a respective embodiment of a magnetic-field sensor 300 and its specifications. In an embodiment, the first magnetization direction of a magnetic-field sensor forms a first angle with the symmetry line, the second magnetization direction forms a second angle with the symmetry line, and the first and second angles differ by less than 5° in magnitude. In other words, the two magnetic bodies 310, 320 in many embodiments of a magnetic-field sensor 300 comprise a symmetrical magnetization with regard to the symmetry line 195.

In addition, the embodiments of a magnetic-field sensor 300 depicted in FIGS. 10*a* and 10*b* again each comprise a magnetic-field sensor arrangement 120 having a substrate 180 and one or more magnetic-field sensor elements 190. As was already described in connection with the above-explained embodiments of a magnetic-field sensor 100, the magnetic-field sensor arrangement may comprise a single magnetic-field sensor element 190 or a plurality of respective magnetic-field sensor elements 190. In the embodiments shown in FIGS. 10*a* and 10*b*, the magnetic-field sensor arrangement 120 in each case comprises two magnetic-field sensor elements 190 arranged essentially symmetrically to the symmetry line 195 which are manufactured by means of, for example, the potential magnetic-field sensor element technologies already discussed above. In this case, too, the magnetic-field sensor elements may include Hall sensor elements, magneto-resistive sensor elements, or other corresponding magnetic-field sensor elements.

It should be noted in this context that because of the above-described problems of the positioning tolerance in the case of real implementations of embodiments of magnetic-field sensors 100, 300, the above-described symmetry properties of the various components may deviate, with regard to the symmetry line 195, only within a predefined tolerance limit, i.e., for example, within a positioning tolerance, which is dependent on the application, in the lateral direction or in the vertical direction. In other words, if the symmetry line 195 relates to a center of, e.g., two magnetic-field sensor elements 190 on the substrate 180 of the magnetic-field sensor arrangement 120, the two magnetic bodies 310, 320, which together form the back-bias magnet may possibly deviate from their respective positions within predefined positioning tolerances. In many cases, the respective positioning tolerances are application-specific and are certainly influenced, for example, by the technology of the magnetic-field sensor elements 190 used.

In addition, a generator object 210 is again drawn in in FIGS. 10*a* and 10*b*, the generator object 210 again being, for example, a rack, a magnet rod, a drilled rod, a toothed wheel, a drilled wheel, or a magnet wheel. Depending on the specific application, other generator objects 210 may also be employed, it possibly being useful in many cases, depending on the specific implementation, to configure the respective generator object 210 such that it is able to cause a modulation, for example, a periodic or sinusoidal modulation, of a magnetic field which (among others) is generated, in this case, by the first magnetic body 310, frequently configured as a permanent magnet, and the second magnetic body 320 of the back-bias magnet arrangement, or of the back-bias magnet.

With respect to the symmetry line 195, in many embodiments of a magnetic-field sensor 300, the first magnetic body 310 and the second magnetic body 320 are configured, or arranged, to be symmetrical to same. In addition to the above-mentioned possibility of performing a definition of the symmetry line 195 with regard to a central position of magnetic-field sensor elements 190, if same are present in a corresponding number and layout, there is naturally also the possibility of defining the symmetry line 195 with regard to a central point or any other corresponding line or mark with respect to the substrate 180. While taking into account the positioning deviations or positioning tolerances of the individual magnetic bodies 310, 320 which are caused, for example, by manufacturing tolerances, they each have a symmetrical installation position with regard to the symmetry line 195.

As was explained before, depending on the specific definition of the location of the symmetry line 195, the two magnetic bodies 310, 320 and/or the locations of the individual magnetic-field sensor elements 190 may comprise corresponding installation tolerances or positioning tolerances with regard to the symmetry line 195. In other words, a center of gravity of the two magnetic bodies 310, 320 may be spaced apart from the symmetry line 195 by a distance typically smaller than a corresponding positioning tolerance.

The same applies not only in the x direction, but also in the y direction, which is perpendicular thereto, as is drawn in FIGS. 10*a* and 10*b*. Depending on the production technology used, in particular on the technology of securing the magnetic bodies with regard to the magnetic-field sensor arrangement 120, positioning errors ranging from several 100 μm to several millimeters thus cannot occur in the x direction and/or y direction as well as in the z direction, which is not shown in FIGS. 10*a* and 10*b*. In other words, the respective positioning tolerances may be in the range of up to several 100 μm, or in the range of up to several millimeters, i.e., in the range of up to about 1000 μm, or in the range of up to about 2 mm.

With regard to the positioning of the individual magnetic-field sensor elements 190 in relation to one magnetic body, respectively, of the two magnetic bodies 310, 320, in many embodiments of a respective magnetic-field sensor 300, provided that the magnetic-field sensor elements 190 and/or of the magnetic bodies 310, 320 are arranged symmetrically, the magnetic-field sensor elements 190 each comprise x coordinates within the range of the x coordinates of one of the two magnetic bodies 310, 320. In other words, in such embodiments of a magnetic-field sensor 300, the associated magnetic-field sensor elements 190 are located above or below the respective magnetic bodies 310, 320.

With respect to the angles formed by the magnetization directions of the individual magnetic bodies 310, 320 and the symmetry line 195, or the line 350 extending perpendicular to same and also drawn in FIGS. 10*a* and 10*b*, in many embodiments of a magnetic-field sensor 300, an angle of the magnetization of one of the two magnetic bodies 310 in many cases forms an angle of between 10° and 80° in terms of magnitude with the symmetry line 195. In many embodiments of a magnetic-field sensor 300, the symmetry line 195 runs perpendicular to a main surface or surface of the substrate 180 having the magnetic-field sensor elements 190 arranged thereon. Accordingly, the respective magnetizations also form an angle, with regard to the line 350, ranging from 10° to 80° in terms of magnitude. In addition, in the case of a symmetric design of the two magnetic bodies 310, 320, the respective magnetizations in each case form an angle with each other which ranges from 20° to 160° in terms of magnitude. Depending on the specific field of application, other ranges of angles, which shall be explained in more detail in the further course of the present application in the context of numeric simulations, may also occur in embodiments of a magnetic-field sensor 300.

The embodiments of a magnetic-field sensor 300 depicted in FIGS. 10*a* and 10*b* differ essentially with respect to the arrangement of the two magnetic bodies 310, 320 in relation to each other. While in the embodiment shown in FIG. 10*a*, the two magnetic bodies 310, 320 immediately adjoin each other, for example, in that they are fixed to each other by means of gluing, in the embodiment shown in FIG. 10*b*, the two magnetic bodies 310, 320 are separated from each other by a respective gap. The gap between the two magnetic bodies 310, 320 may be filled, for example, with a magnetic or non-magnetic material, which serves, for example, for attachment or serves the overall architecture of the embodiment of a magnetic-field sensor 300. For example, a plastic attachment may be partly or fully inserted between the two magnetic bodies 310, 320, to which plastic attachment the two magnetic bodies 310, 320 are glued or otherwise attached. Alternatively or additionally, the two magnetic bodies 310, 320 may also be fixed to one another within the framework of the overall installation of the magnetic-field sensor arrangement 120, so that encapsulating material at least partly enters into the gap between the two magnetic bodies 310, 320.

As was already set forth in the context of the embodiment shown in FIGS. 3a, 3b of a magnetic-field sensor 100, in embodiments of a magnetic-field sensor 300, too, the magnetic-field sensor arrangement 120 with its substrate 180 and the magnetic-field sensor elements 190 may, for its part, comprise a package.

Of course, it is also possible, in principle, that no solid material is inserted between the two magnetic bodies 310, 320, as is shown in FIG. 10b, but that rather the two magnetic bodies 310, 320 are directly connected or glued to the magnetic-field sensor arrangement 120. In such a case, introducing a material between the two magnetic bodies 310, 320 may possibly be dispensed with.

In the embodiments of a magnetic-field sensor 300 which are shown in FIGS. 10a and 10b, two individual magnets as magnetic bodies 310, 320 are assembled to form a new magnet or back-bias magnet such that, again, the symmetry conditions given in equation (1) apply to the magnetization components of the overall arrangement of the two magnetic bodies. This, too, again corresponds to an inhomogeneous (bulk) magnetization with respect to the overall arrangement of the two magnetic bodies 310, 320. More specifically, this corresponds to an inhomogeneously magnetized bulk magnet, each half of the volume of which consists of one homogeneously magnetized magnetic body, or one homogeneous area, respectively. In FIGS. 10a and 10b, in the embodiments of a magnetic-field sensor which are shown there, a second cube is joined with an oblique magnetization, respectively, as possibly the simplest example.

Depending on the specific implementation, for example, the two magnetic bodies 310, 320 may be configured as two block magnets having a width of about 2 mm and a height of about 5 mm, and may be bonded to one another back to back. Both individual magnetic bodies 310, 320 in this context are homogeneously magnetized, a remanence of about Brem=1 T prevailing in the respective direction shown by the magnetization, or the arrows 330, 340, again depending on the specific implementation. In some embodiments, the magnetization direction may comprise, for example, an angle of +/−500 with respect to the symmetry line 195, i.e., to the vertical direction.

Some embodiments of a magnetic-field sensor 300, which correspond to the arrangements of FIGS. 10a and 10b, provide very good results with regard to a combination with a magnetic-field sensor arrangement comprising magneto-resistive sensor elements. In addition, they may frequently be manufactured in a particularly simple manner since the respective magnetic bodies 310, 320 as homogeneously magnetized individual magnets may be manufactured in a comparatively simple manner.

As it was the case already in the context of the embodiments of a magnetic-field sensor 300 which are shown in FIGS. 3a and 3b, it may also be useful in this case, depending on the specific implementation, to implement the magnetic-field sensor arrangement 120 such that it is mirrored with respect to the line 350, so that the magnetic-field sensor elements 190 in connection with the finished magnetic-field sensor face the generator object 210.

As is schematically depicted in FIG. 10b, the two magnetic bodies 310, 320 may also be spaced apart from each other by a non-magnetic gap. Depending on the specific implementation, this may be helpful in installation, for example, since a corresponding distance may be configured as an adhesive surface. In addition, there is also the possibility of influencing an interaction of the two magnetic bodies 310, 320 by introducing such a non-magnetic gap, so that they may not superimpose or influence each other to such a large degree.

Thus, some embodiments of a magnetic-field sensor 300 with regard to the back-bias magnet formed by the two magnetic bodies 310, 320 are based on the idea that when the field lines of a magnet diverge, a second magnet may be arranged next to it, the second magnet canceling out the undesired components of the first magnet.

Figure 11:
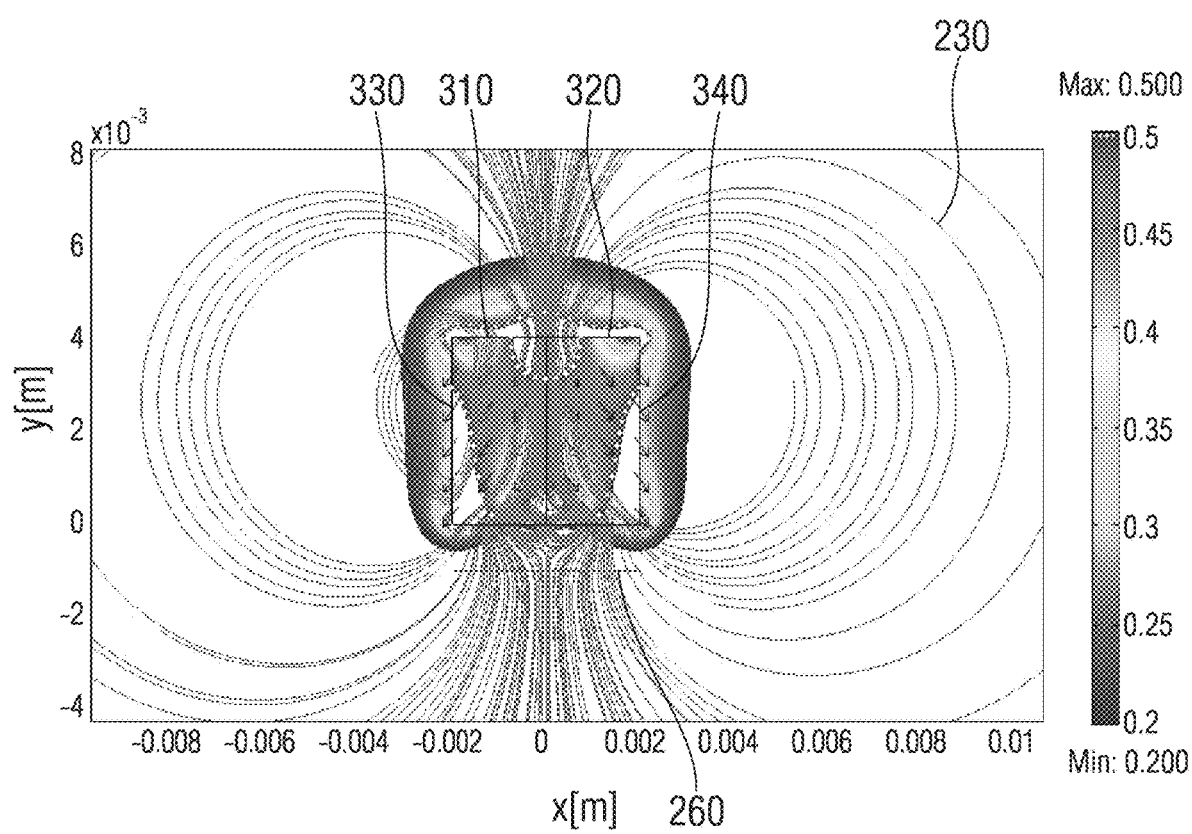
FIG. 11 shows a result of a numeric simulation with respect to a magnetic flux density of an embodiment of a magnetic-field sensor.

FIG. 11 shows a result of a numeric simulation of a magnetic flux density distribution of an embodiment of a magnetic-field sensor 300 as is schematically shown in FIG. 10a. In addition to a number of field lines 230, FIG. 11 shows a magnetic flux density distribution calculated in the area of the two magnetic bodies 310, 320 and ranging from 0.2 to 0.5 T. As is already schematically shown in FIG. 10a, the two magnetic bodies 310, 320 have a magnetization having a magnetic remanence of Brem=1 T, which is also indicted by the arrows 330, 340 in FIG. 11. The magnetic flux density distribution resulting therefrom is reproduced in accordance with the gray scale distribution depicted in FIG. 11, a maximum magnetic flux density prevailing at a contact area of the two magnetic bodies 310, 320, while a magnetic flux density clearly smaller than same prevailing outside the two magnetic bodies 310, 320.

Figure 12A:
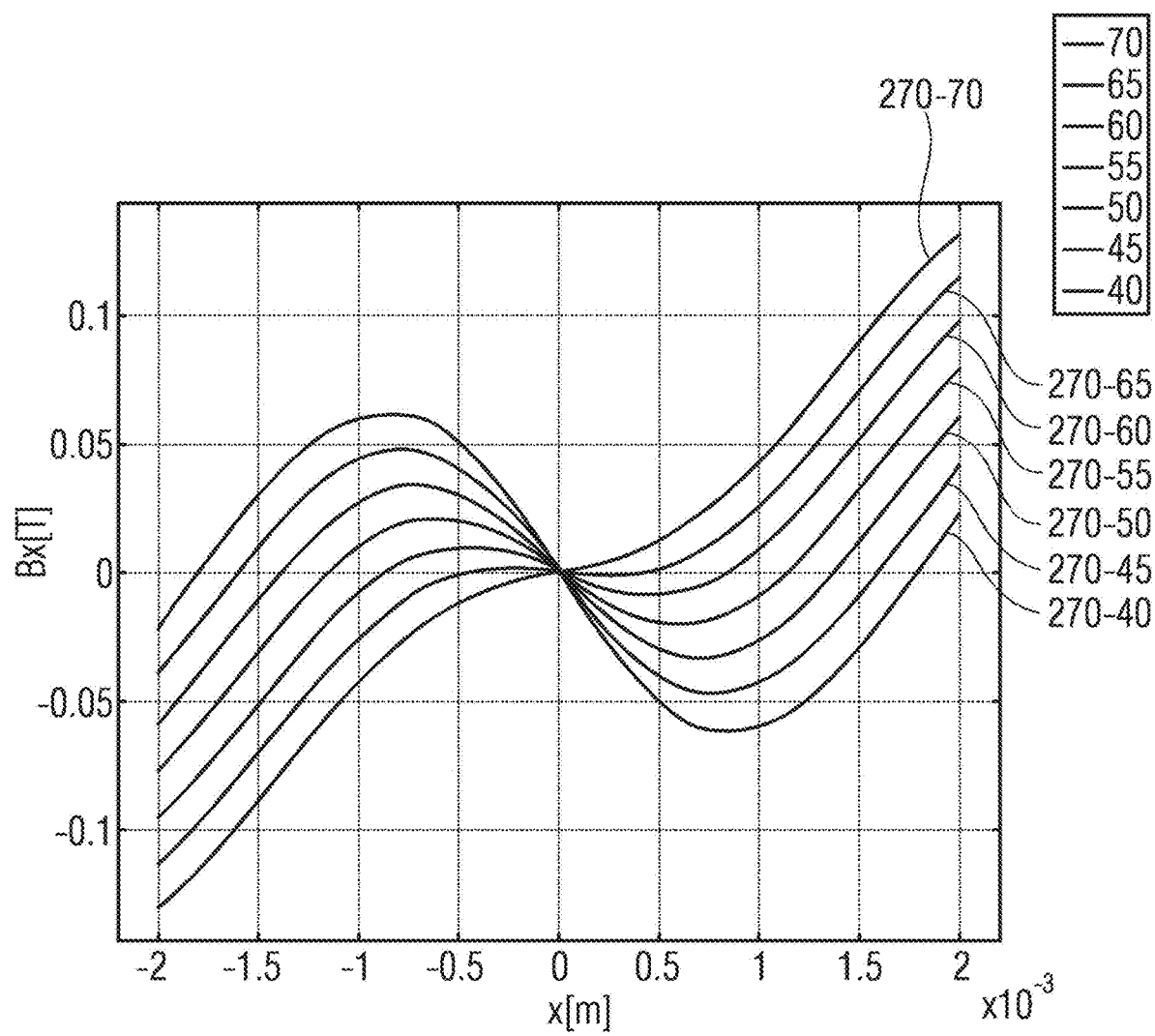
FIGS. 12a and 12b show various curves of x components of the magnetic flux density for the numeric simulation shown in FIG. 11.

In addition, FIG. 11 depicts a line 260, with respect to which FIG. 12a shows an x component of the magnetic flux density Bx in a range from x=−2 mm to x=+2 mm for a y coordinate of y=−1 mm. Here, the numeric simulation shown in FIG. 11 is based on two cubic magnets or magnetic bodies 310, 320 each having a homogeneous magnetization which, however, forms an angle of +/−350 with the y or By axes extending vertically downward. Consequently, there is an angle of 55°, in terms of magnitude, between the two magnetizations of the two magnetic bodies 310, 320 and the horizontal.

As was briefly indicated above, FIG. 12a shows the x component Bx as a function of the x coordinate for a y value of y=−1 mm, which corresponds to the line 260 shown in FIG. 11. Subsequently, FIG. 12b shows the corresponding x components of the magnetic flux density Bx as a function of the x coordinate for a y value of y=−1.5 mm, which is not drawn in in FIG. 11, however.

In the event of a y value of y=−1 mm, FIG. 12a shows the x component of the magnetic flux density Bx in the range from x=−2 mm to x=+2 mm for various angles of the magnetizations of the two magnetic bodies 310, 320. Here, the simulations are based on the above-explained symmetry of the magnetization directions of the two magnetic bodies 310, 320, each of which forms an angle, in terms of magnitude, with the horizontal in each case, the angles being reproduced using the reference numerals of the individual curves 270. The curve 270-70 is based on an angle of 70° of the magnetizations of the two magnetic bodies 310, 320 with the horizontal, so that for this simulation or calculation, the magnetizations of the two magnetic bodies form an angle of 20° with the symmetry line 195 of FIG. 10a. Accordingly, the curve 270-55 corresponds to the case shown in FIG. 11 of an angle of 35° between the vertical symmetry line 195, or to an angle of 55° of the magnetization and the horizontal.

Figure 12B:
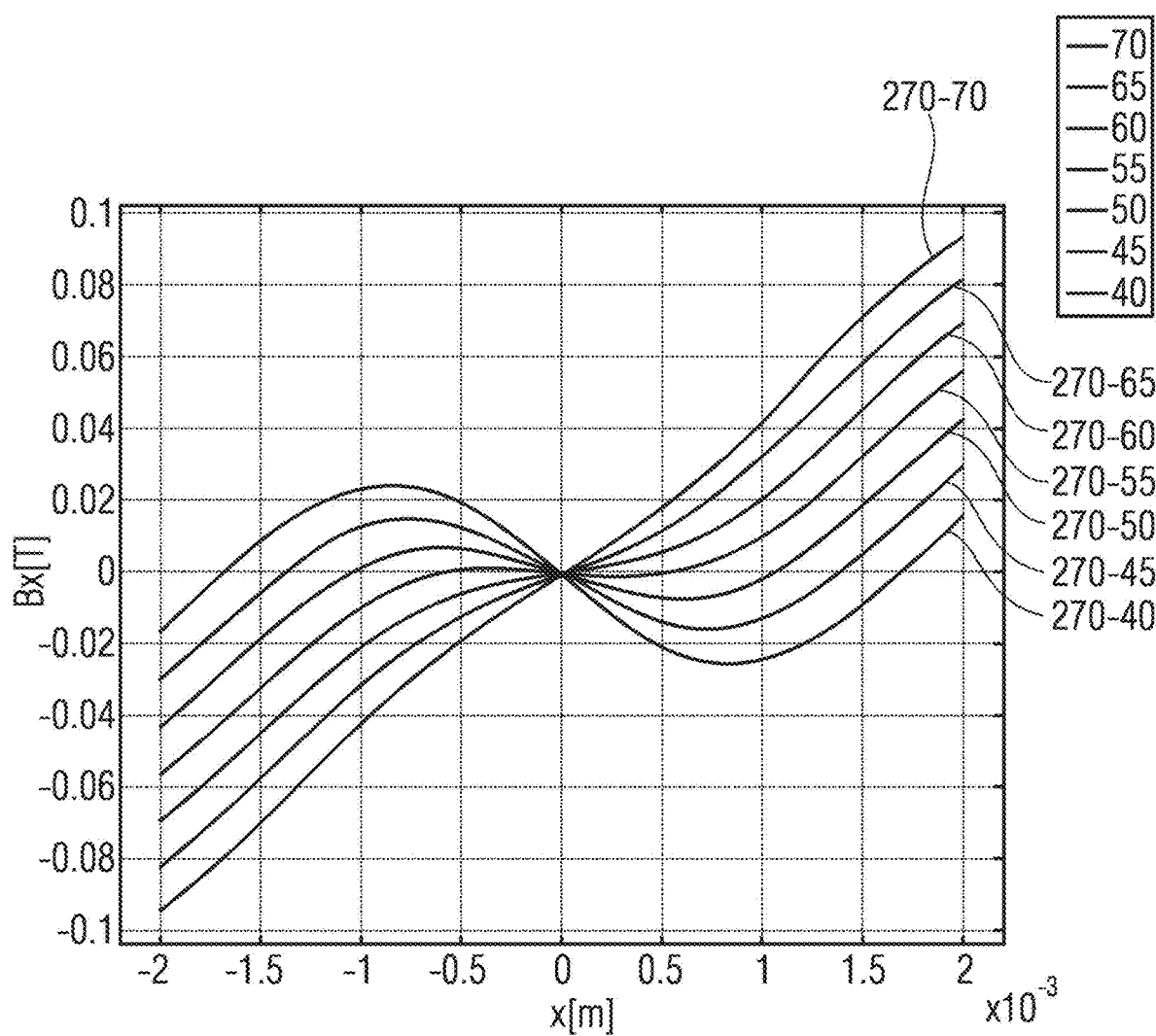

Accordingly, FIG. 12*b* shows several curves 270 for angles ranging from 40° to 70°, which are formed by the magnetizations of the two magnetic bodies 310, 320 and the horizontal. Consequently, the curves 270-40 to 270-70 depicted in FIG. 12*b* correspond to angles ranging from 20° (curve 270-70) to 50° (curve 270-40) of the magnetizations of the magnetic bodies 310, 320 with respect to the vertical symmetry line 195 shown in FIG. 10*a*. Especially in the case, shown in FIG. 12*b*, of a vertical distance of 1.5 mm of the magnetic-field sensor elements 190 from the lower edge of the two magnetic bodies 310, 320 (y=−1.5 mm; the magnet ends at y=0 mm), it may be seen that the condition |Bx|<20 mT may be met for further ranges of the x coordinates in the case of y=−1.5 mm. Since this may also be met for the case shown in FIG. 12*a* in the range of further x coordinates, there is thus the possibility, in particular, of implementing magneto-resistive magnetic-field sensor elements 190 using an embodiment of a magnetic-field sensor 300 as is schematically shown, for example, in FIG. 10*a* or 10*b*, without the magnetic-field sensor elements 190 being driven into saturation by the respective x components of the magnetic fields caused by the magnetic bodies 310, 320.

In other words, using an embodiment of a magnetic-field sensor 300, a horizontal component of a magnetic flux density (for example, x component) Bx may be created within a comparatively wide range of x and y coordinates, the component not causing a saturation of magneto-resistive sensor elements 190. In the case of GMR sensor elements, FIGS. 12*a* and 12*b* thus show that a condition |Bx|<20 mT, which applies to many GMR sensor elements, may be met for wide ranges of x and y coordinates.

In addition, FIGS. 12*a* and 12*b* show that by varying the directions of the two magnetic bodies 310, 320, the respective ranges may be shifted such that different distances may be realized between magnetic-field sensor elements 190. Thus, it is possible to provide different embodiments of magnetic-field sensors 300 having different mutual distances of the magnetic-field sensor elements 190.

In summary, one may state that by using corresponding embodiments of magnetic-field sensors 300 comprising (at least) two magnetic bodies 310, 320, magnetic systems may be built, so that the respective magnetic-field sensor elements 190 are not driven into saturation even in the case of sensitive magneto-resistive sensor elements, i.e., GMR sensor elements, for example.

Figure 13:
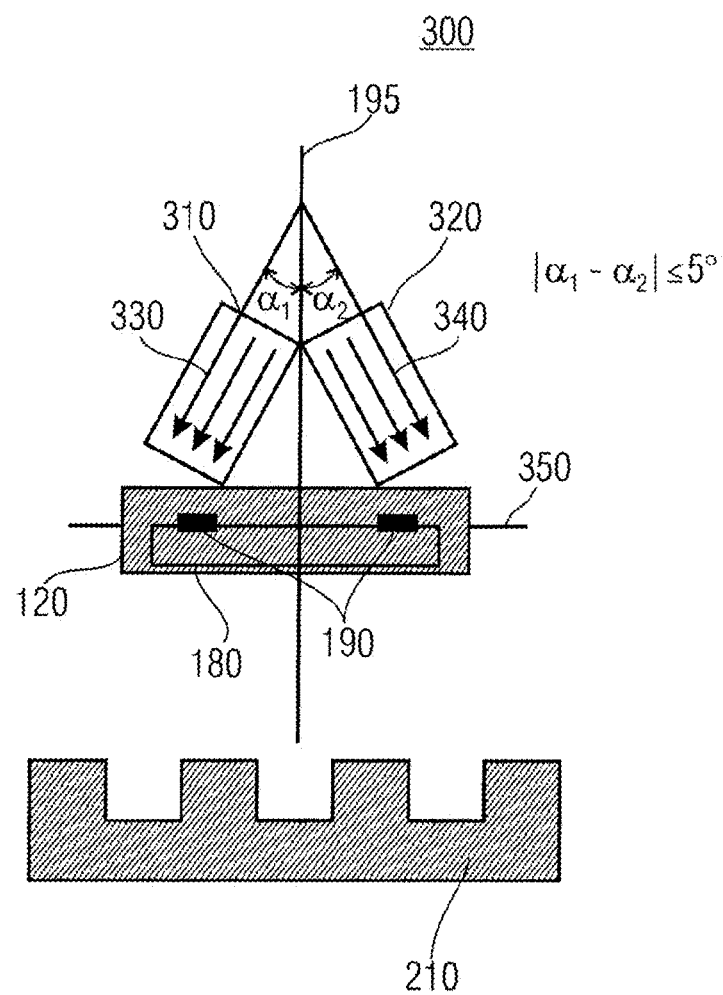
FIG. 13 shows a cross-sectional representation of a further embodiment of a magnetic-field sensor.

FIG. 13 shows a further embodiment of a magnetic-field sensor 300 which differs from the embodiments, shown in FIGS. 10*a* and 10*b*, of a magnetic-field sensor 300 essentially in that the two magnetic bodies 310, 320 no longer comprise, with respect to their geometric shapes, an oblique magnetization, but rather are perpendicularly magnetized with respect to a front face. In this case, the two magnetic bodies 310, 320 are no longer arranged in parallel with respect to their side faces, as was the case in the embodiments in FIGS. 10*a* and 10*b*. Rather, in order to achieve the two different magnetization directions of the two magnetic bodies 310, 320, they are now arranged, for their part, at a respective angle with respect to the symmetry line 195 or to the line 350 perpendicular to same.

Thus, in this case, too, the first magnetic body 310 and the second magnetic body 320 comprise differing first and second magnetization directions, respectively. Thus, an inhomogeneous bulk magnetization is achieved, also in the case of such an arrangement of magnetic bodies 310, 320, by superimposing the magnetic fields of the two (homogeneously magnetized) magnetic bodies 310, 320.

In other words, respective arrangements of magnetic bodies 310, 320 comprising different magnetization directions, respectively, may be found by employing two cubic magnets or magnetic bodies which are magnetized in the longitudinal direction and are implemented and installed such that they are tilted by a respective angle, e.g., +/−35°, relative to the y axis, instead of using two slanted or oblique magnetized magnetic bodies 310, 320. In other words, for embodiments of magnetic-field sensors 300 it is irrelevant whether the two different magnetization directions of the two magnetic bodies 310, 320, as are represented by the arrows 330 and 340, are created by using magnetic bodies comprising different, slanted magnetizations, or whether magnetic bodies comprising identical magnetizations are employed, which, however, are built in an accordingly slanted manner or using corresponding installation directions within the context of the respective embodiment of the magnetic-field sensor 300.

With regard to the more specific installation positions of the individual magnetic bodies 310, 320 in an embodiment as is depicted in FIG. 13, the above explanations shall also apply, of course, the only difference being, in this case, that the respective magnetic bodies 310, 320 now is rotated accordingly.

Actually, there is a very large degree of freedom with regard to the specific shapes of the individual magnetic bodies 310, 320. In principle, any shapes conceivable of respective magnetic bodies may be used. For example, cubic, cylindrical and other magnetic bodies, for example, magnetic bodies which taper off, are feasible. In addition, of course, not only homogeneously magnetized magnetic bodies may be used in the context of the two magnetic bodies 310, 320, as was implicitly assumed in the embodiments previously described, but use may naturally also be made of inhomogeneously magnetized magnetic bodies. In other words, the magnetic bodies 310, 320 may also be implemented inhomogeneously with regard to their magnetization directions and their magnetization intensities.

Embodiments of magnetic field sensors 100, 300 thus enable to reduce horizontal magnetic-field components, or horizontal components, of the magnetic flux density by using inhomogeneous magnetization of the magnetic body 110, or of the back-bias magnet, the latter including at least the two magnetic bodies 310, 320, to such a degree that, for example, magneto-resistive sensors (xMR sensors) are no longer overdriven, i.e., driven into saturation. As was already explained above, embodiments of magnetic-field sensors 100 therefore enable to reduce the flux density component, which in the context of the present application is casually also referred to as the Bx field of the back-bias magnet, by means of the inhomogeneous magnetizations described to such a degree that respective overdriving of the sensors or sensor elements will not occur.

Embodiments of the present invention in the form of magnetic-field sensors 100, 300 achieve a field line curve desired in that, among other things, the respective components of the resulting magnetic flux density are limited by an inhomogeneous magnetization of the magnetic bodies 110, 310, 320. Accordingly, embodiments of magnetic-field sensors 100, 300 may possibly also be produced without implementing magnetic bodies with extremely filigree shapes or recesses, or respective embodiments of magnetic-field sensors 100, 300 may possibly also be developed and built without using highly permeably parts as magnetic lenses for field-line deformation. Embodiments of respective magnetic-field sensors 100, 300 may be used, among other things, for magneto-resistive speed sensors while employing respective back-bias magnet circuits in the form of the magnetic bodies 110, 310, 320. Examples of use of respective embodiments of magnetic-field sensors are found in the automobile sector as well as other sectors, such as mechanical engineering, plant engineering, aircraft construction, shipbuilding, and other fields of technology where magnetic fields need to be detected.

Depending on the conditions, embodiments of the inventive methods may be implemented in hardware or in software. Implementation may be performed on a digital storage medium, in particular a disk, CD or DVD comprising electronically readable control signals which may cooperate with a programmable computer system such that an embodiment of an inventive method is performed. Generally, an embodiment of the present invention thus also consists in a software program product, or a computer program product, or a program product, comprising a program code, stored on a machine-readable carrier, for performing an embodiment of an inventive method, when the software program product runs on a computer or a processor. In other words, an embodiment of the present application may thus be realized as a computer program, or a software program, or a program comprising a program code for performing an embodiment of a method, when the program runs on a processor. The processor may be formed by a computer, a chip card (smart card), a central processor (CPU=central processing unit), an application-specific integrated circuit (ASIC), or any other integrated circuit, respectively.

Computer programs, software programs or programs may be employed, for example, in the context of the manufacturing process, i.e., for example, for controlling the manufacture of respective embodiments of magnetic-field sensors. Respective programs may thus be employed and used in the context of manufacturing plants for controlling same, but also in the context of designing and in the context of laying out respective embodiments of magnetic-field sensors. As the above listing has already shown, processors are not to be understood in the sense of classical computer processors only, but also in the sense of application-specific processors as occur, for example, in the context of machine tools and other production-relevant installations.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A magnetic-field sensor comprising:
a magnetic-field sensor arrangement; and
a magnetic body comprising an inhomogeneous magnetization, wherein the inhomogeneous magnetization comprises a first magnetization vector M at a first point within the magnetic body pointing in a different direction from a second magnetization vector M at a second point within the magnetic body, the magnetic body is a single piece, and the first and second magnetization vectors M are neither parallel nor antiparallel,
wherein the magnetic body comprises a recess facing the magnetic-field sensor arrangement and resulting in a non-convex cross-sectional area,
wherein the magnetic body is annular or comprises an annular section, and
wherein the magnetic body is fixedly arranged with respect to the magnetic-field sensor arrangement and forms a back-bias magnet for the magnetic-field sensor arrangement.

2. The magnetic-field sensor as claimed in claim 1, wherein the inhomogeneous magnetization comprises a radial magnetization directed at a central point.

3. The magnetic-field sensor as claimed in claim 2, wherein the magnetic body comprises the radial magnetization in at least 50% of a volume of the magnetic body.

4. The magnetic-field sensor as claimed in claim 1, wherein the inhomogeneous magnetization comprises an azimuthal magnetization which is tangentially directed with respect to a connecting line to a central point.

5. The magnetic-field sensor as claimed in claim 4, wherein the magnetic body comprises the azimuthal magnetization in at least 50% of a volume of the magnetic body.

6. The magnetic-field sensor as claimed in claim 1, wherein the magnetic body comprises a maximum deviation of a magnitude of the inhomogeneous magnetization of the magnetic body, the maximum deviation being smaller than or equal to 20% of a maximum magnitude of the inhomogeneous magnetization of the magnetic body.

7. The magnetic-field sensor as claimed in claim 1, wherein the magnetic-field sensor arrangement comprises a first magnetic-field sensor element and a second magnetic-field sensor element, the first magnetic-field sensor element being arranged, with respect to the magnetic body, such that the first magnetic-field sensor element is exposed, with regard to a predetermined spatial direction, to a first magnetic flux density caused by the magnetic body and being within a first flux density range, and the second magnetic-field sensor element being arranged, with respect to the magnetic body, such that the second magnetic-field sensor element is exposed, with regard to the predetermined spatial direction, to a second magnetic flux density caused by the magnetic body and being within a second flux density range.

8. The magnetic-field sensor as claimed in claim 7, wherein the first flux density range and the second flux density range enable operation of the first and second magnetic-field sensor elements outside a saturation range.

9. The magnetic-field sensor as claimed in claim 7, wherein the first and second flux density ranges only comprise values smaller than or equal to 20 mT in magnitude.

10. The magnetic-field sensor as claimed in claim 7, wherein the first and second magnetic-field sensor elements are magneto-resistive sensor elements.

11. The magnetic-field sensor as claimed in claim 7, wherein the first and second magnetic-field sensor elements are arranged on a substrate, and wherein the predetermined spatial direction is parallel to a main surface of the substrate.

12. A method of operating a magnetic-field sensor comprising: a magnetic-field sensor arrangement; and a magnetic body comprising an inhomogeneous magnetization, wherein the inhomogeneous magnetization comprises a first magnetization vector M at a first point within the magnetic body pointing in a different direction from a second magnetization vector M at a second point within the magnetic body, the magnetic body is a single piece, and the first and second magnetization vectors M are neither parallel nor antiparallel, the magnetic body comprises a recess facing the magnetic-field sensor arrangement and resulting in a non-convex cross-sectional area, the magnetic body is annular or comprises an annular section, and the magnetic body is fixedly arranged with respect to the magnetic-field sensor arrangement and forms a back-bias magnet for the magnetic-field sensor arrangement, the method comprising:

sensing a motion of a generator object using the magnetic-field sensor arrangement and the magnetic body.

13. The method as claimed in claim 12, wherein the generator object is a rotating wheel.

14. The method as claimed in claim 13, wherein the rotating wheel is a toothed wheel.

15. The method as claimed in claim 12, wherein the inhomogeneous magnetization comprises a radial magnetization directed at a central point.

16. The method as claimed in claim 12, the magnetic body comprises a maximum deviation of a magnitude of the inhomogeneous magnetization of the magnetic body, the maximum deviation being smaller than or equal to 20% of a maximum magnitude of the inhomogeneous magnetization of the magnetic body.

17. A system comprising:
a magnetic-field sensor comprising:
a magnetic-field sensor arrangement; and
a magnetic body comprising an inhomogeneous magnetization, wherein the inhomogeneous magnetization comprises a first magnetization vector M at a first point within the magnetic body pointing in a different direction from a second magnetization vector M at a second point within the magnetic body, the magnetic body is a single piece, and the first and second magnetization vectors M are neither parallel nor antiparallel,
wherein the magnetic body comprises a recess facing the magnetic-field sensor arrangement and resulting in a non-convex cross-sectional area,
wherein the magnetic body is annular or comprises an annular section, and
wherein the magnetic body is fixedly arranged with respect to the magnetic-field sensor arrangement and forms a back-bias magnet for the magnetic-field sensor arrangement; and
a rotatable object disposed adjacent to the magnetic-field sensor.

18. The system as claimed in claim 17, wherein the rotatable object is a rotating wheel.

19. The system as claimed in claim 18, wherein the rotating wheel is a toothed wheel.

20. The system as claimed in claim 17, wherein the magnetic-field sensor arrangement comprises a first magnetic-field sensor element and a second magnetic-field sensor element, the first magnetic-field sensor element being arranged, with respect to the magnetic body, such that the first magnetic-field sensor element is exposed, with regard to a predetermined spatial direction, to a first magnetic flux density caused by the magnetic body and being within a first flux density range, and the second magnetic-field sensor element being arranged, with respect to the magnetic body, such that the second magnetic-field sensor element is exposed, with regard to the predetermined spatial direction, to a second magnetic flux density caused by the magnetic body and being within a second flux density range.

* * * * *